US011882705B2

(12) United States Patent
Song et al.

(10) Patent No.: US 11,882,705 B2
(45) Date of Patent: Jan. 23, 2024

(54) THREE-DIMENSIONAL SEMICONDUCTOR MEMORY DEVICE, OPERATING METHOD OF THE SAME AND ELECTRONIC SYSTEM INCLUDING THE SAME

(71) Applicant: Samsung Electronics Co., Ltd., Suwon-si (KR)

(72) Inventors: Yun Heub Song, Seongnam-si (KR); Sun Jun Choi, Namyangju-si (KR); Chang Hwan Choi, Seoul (KR); Jae Kyeong Jeong, Seoul (KR)

(73) Assignee: Samsung Electronics Co., Ltd., Suwoni-si (KR)

( * ) Notice: Subject to any disclaimer, the term of this patent is extended or adjusted under 35 U.S.C. 154(b) by 0 days.

(21) Appl. No.: 17/951,591

(22) Filed: Sep. 23, 2022

(65) Prior Publication Data
US 2023/0019540 A1 Jan. 19, 2023

Related U.S. Application Data

(62) Division of application No. 17/329,907, filed on May 25, 2021, now Pat. No. 11,456,319.

(30) Foreign Application Priority Data

Jun. 5, 2020 (KR) .................. 10-2020-0068006
Apr. 27, 2021 (KR) .................. 10-2021-0054516

(51) Int. Cl.
*G11C 11/34* (2006.01)
*H10B 51/20* (2023.01)
(Continued)

(52) U.S. Cl.
CPC ............ *H10B 51/20* (2023.02); *G11C 11/223* (2013.01); *G11C 11/2259* (2013.01);
(Continued)

(58) Field of Classification Search
CPC ...... H10B 51/20; H10B 51/30; G11C 11/223; G11C 11/2259; G11C 11/2275; H10L 29/24; H10L 29/516
(Continued)

(56) References Cited

U.S. PATENT DOCUMENTS 7,095,075 B2   8/2006  Forbes
7,233,522 B2 *  6/2007  Chen .................. G11C 16/3418
                                                365/185.11
(Continued)

FOREIGN PATENT DOCUMENTS

JP   2015-015334 A   1/2015
JP   2019510362 A   4/2019
(Continued)

OTHER PUBLICATIONS

Non-Final Office Action issued in parent U.S. Appl. No. 17/329,907 dated Jan. 28, 2022.
(Continued)

*Primary Examiner* — Viet Q Nguyen
(74) *Attorney, Agent, or Firm* — Myers Bigel, P.A.

(57) ABSTRACT

Provided are a three-dimensional semiconductor memory device, a method for manufacturing the same, a method for operating the same, and an electronic system including the same. The three-dimensional semiconductor memory device includes a substrate, a stack structure on the substrate, and vertical channel structures, which are provided in channel holes penetrating the stack structure, wherein each of the vertical channel structures includes a data storage pattern, a vertical channel pattern, a conductive pad, and a vertical semiconductor pattern, wherein the vertical channel pattern includes a first portion contacting the upper surface of the substrate and a second portion provided between the data storage pattern and the vertical semiconductor pattern, and (Continued)

wherein the vertical semiconductor pattern is spaced apart from the substrate with the first portion of the vertical channel pattern therebetween.

18 Claims, 16 Drawing Sheets

(51) Int. Cl.
    *H01L 29/24* (2006.01)
    *H01L 29/51* (2006.01)
    *G11C 11/22* (2006.01)
    *H10B 51/30* (2023.01)

(52) U.S. Cl.
    CPC .......... *G11C 11/2275* (2013.01); *H01L 29/24* (2013.01); *H01L 29/516* (2013.01); *H10B 51/30* (2023.02)

(58) Field of Classification Search
    USPC .......................................................... 365/45
    See application file for complete search history.

(56) References Cited

U.S. PATENT DOCUMENTS

| | | | |
|---|---|---|---|
| 7,433,233 B2* | 10/2008 | Chen | G11C 16/3418 365/185.23 |
| 7,505,321 B2* | 3/2009 | Scheuerlein | H10B 43/30 365/185.11 |
| 7,852,682 B2* | 12/2010 | Byeon | G11C 16/0483 365/185.23 |
| 8,045,380 B2* | 10/2011 | Byeon | G11C 16/10 365/185.23 |
| 8,441,858 B2* | 5/2013 | Sarin | G11C 16/10 365/185.24 |
| 9,281,044 B2* | 3/2016 | Ramaswamy | H01L 29/78391 |
| 9,287,271 B2 | 3/2016 | Wang et al. | |
| 9,530,794 B2* | 12/2016 | Ramaswamy | G11C 11/223 |
| 9,941,299 B1 | 4/2018 | Chen et al. | |
| 10,381,369 B2 | 8/2019 | Kim et al. | |
| 10,403,815 B2 | 9/2019 | Ino | |
| 10,629,617 B2 | 4/2020 | Lee | |
| 10,734,409 B2 | 8/2020 | Yoo | |
| 10,756,185 B2 | 8/2020 | Choi et al. | |
| 10,910,064 B2 | 2/2021 | Rabkin et al. | |
| 10,923,500 B2* | 2/2021 | Ino | H10B 53/30 |
| 11,222,697 B2* | 1/2022 | Nam | G11C 16/3427 |
| 11,282,559 B1* | 3/2022 | Tanaka | G11C 11/2275 |
| 11,456,319 B2* | 9/2022 | Song | H10B 51/30 |
| 2010/0317158 A1 | 12/2010 | Yilmaz et al. | |
| 2015/0279857 A1 | 10/2015 | Kim et al. | |
| 2016/0181259 A1 | 6/2016 | Van Houdt et al. | |
| 2021/0296360 A1* | 9/2021 | Hsu | G11C 13/0028 |

FOREIGN PATENT DOCUMENTS

| | | |
|---|---|---|
| KR | 20110108219 A | 10/2011 |
| KR | 20180096878 A | 8/2018 |
| KR | 20200032580 A | 3/2020 |
| KR | 10-2142591 B1 | 8/2020 |
| WO | 2018236353 A1 | 12/2018 |

OTHER PUBLICATIONS

Notice of Allowance issued in parent U.S. Appl. No. 17/329,907 dated May 25, 2022.

* cited by examiner

THREE-DIMENSIONAL SEMICONDUCTOR MEMORY DEVICE, OPERATING METHOD OF THE SAME AND ELECTRONIC SYSTEM INCLUDING THE SAME

CROSS-REFERENCE TO RELATED APPLICATIONS

This is a divisional of U.S. application Ser. No. 17/329,907 filed on May 25, 2021, which claims priority under 35 U.S.C. § 119 from Korean Patent Application Nos. 10-2020-0068006, filed on Jun. 5, 2020 and 10-2021-0054516, filed on Apr. 27, 2021, the entire contents of which are hereby incorporated by reference.

BACKGROUND

The present disclosure herein relates to a three-dimensional semiconductor memory device, and more particularly, to a three-dimensional semiconductor memory device with improved electrical characteristics, a method for manufacturing the same, a method for operating the same, and an electronic system including the same.

It is required to increase integration density of a semiconductor device to satisfy the requirements of a low price and excellent performance that consumers require. The integration density of a semiconductor device is an important factor that determines the price of a product, and thus increased integration density is particularly required. The integration density of a two-dimensional or planar semiconductor device is mostly determined by the area occupied by a unit memory cell, and is thus significantly affected by the level of a micropattern forming technology. However, the integration density of a semiconductor device is increasing but is still limited since high-priced equipment is required for micropatterning. Therefore, three-dimensional semiconductor devices having three-dimensionally arranged memory cells are proposed.

SUMMARY

The present disclosure provides a three-dimensional semiconductor memory device with improved electrical characteristics, a method for manufacturing the same, a method for operating the same, and an electronic system including the same.

The purposes of the present disclosure are not limited to the above-mentioned purposes, and other purposes not mentioned would be clearly understood by those skilled in the art from the disclosure below.

An embodiment of the inventive concept provides a three-dimensional semiconductor memory device including: a substrate; a stack structure including interlayer dielectric layers and gate electrodes alternately stacked on the substrate; and vertical channel structures, which are provided in channel holes penetrating the stack structure and extend in a direction perpendicular to an upper surface of the substrate, wherein each of the vertical channel structures includes: a data storage pattern conformally covering an inner sidewall of the channel holes and having a single-layer structure including a ferroelectric material; a vertical channel pattern covering a sidewall of the data storage pattern and including an oxide semiconductor material; a conductive pad on an upper surface of the vertical channel pattern; and a vertical semiconductor pattern surrounded by the vertical channel pattern and the conductive pad, wherein the vertical channel pattern includes a first portion contacting the upper surface of the substrate and a second portion provided between the data storage pattern and the vertical semiconductor pattern, and wherein the vertical semiconductor pattern is spaced apart from the substrate with the first portion of the vertical channel pattern therebetween.

In an embodiment, the vertical semiconductor pattern may include a silicon-based material.

In an embodiment, the substrate may be a semiconductor substrate doped with an impurity of a first conductivity type, and the vertical semiconductor pattern may include polysilicon doped with an impurity of the first conductivity type.

In an embodiment, the conductive pad may include a semiconductor material doped with an impurity of a second conductivity type different from the first conductivity type.

In an embodiment, the data storage pattern may include at least one of $HfO_x$ having an orthorhombic crystal structure, or $PZT(Pb(Zr, Ti)O_3)$, $PTO(PbTiO_3)$, $SBT(SrBi_2Ti_2O_9)$, $BLT(Bi(La, Ti)O_3)$, $PLZT(Pb(La, Zr)TiO_3)$, $BST(Bi(Sr, Ti)O_3)$, barium titanate $(BaTiO_3)$, P(VDF-TrFE), PVDF, $AlO_x$, $ZnO_x$, $TiO_x$, $TaO_x$, or $InO_x$, doped with at least one of Al, Zr, or Si.

In an embodiment, the vertical channel pattern may include an oxide semiconductor material or group-IV semiconductor material including at least one of In, Zn, or Ga.

In an embodiment, the data storage pattern may have a pipe shape of a macaroni shape whose bottom end is opened, and the vertical channel pattern may a pipe shape of a macaroni shape whose bottom end is closed.

In an embodiment, at least a portion of the conductive pad may overlap an uppermost one among the gate electrodes in a horizontal direction.

In an embodiment, a portion of the first portion of the vertical channel pattern may overlap a lowermost one among the gate electrodes in a horizontal direction.

In an embodiment, the conductive pad may have a step at which a width of the conductive pad changes discontinuously, and a sidewall of the conductive pad may contact an uppermost one among the interlayer dielectric layers.

In an embodiment, each of the vertical channel structures may further include a buried insulation pattern filling a space surrounded by the vertical semiconductor pattern and the conductive pad.

In an embodiment, the buried insulation pattern may have a step at which a width of the buried insulation pattern changes discontinuously, a lower portion of the buried insulation pattern positioned at a lower level than the step may be surrounded by the vertical semiconductor pattern, an upper portion of the buried insulation pattern positioned at a higher level than the step may be surrounded by a portion of the vertical semiconductor pattern and the conductive pad, and a width of the upper portion may be larger than a width of the lower portion.

In an embodiment, the conductive pad may have a uniform thickness, and a lower surface of the conductive pad may coplanar with an upper surface of the vertical semiconductor pad and an upper surface of the buried insulation pattern, and may be positioned at a higher level than a lower surface of an uppermost one among the gate electrodes.

In an embodiment, each of the channel holes may include a first channel hole penetrating a portion of the substrate and the stack structure and a second channel hole connected to the first channel hole, the first and second channel holes may have different diameters at a boundary at which the first and second channel holes are connected to each other, and each of the vertical channel structures may include a first structure filling the first channel hole and a second structure provided on the first structure and filling the second channel hole.

In an embodiment of the inventive concept, a method for manufacturing a three-dimensional semiconductor memory device includes: forming a mold structure including interlayer dielectric layers and sacrificial films alternately stacked on a substrate; forming channel holes penetrating the mold structure; forming vertical channel structures in the channel holes; forming a separation trench having a line shape and extending in one direction while penetrating the mold structure; selectively removing the sacrificial films exposed by the separation trench; and forming gate electrodes filling spaces in which the sacrificial films have been removed, wherein the forming of the vertical channel structures includes: forming a data storage pattern conformally covering an inner sidewall of each of the channel holes; forming a vertical channel pattern covering a sidewall of the data storage pattern; forming a vertical semiconductor pattern filling a space surrounded by the vertical channel pattern; recessing an upper portion of the vertical channel pattern and an upper portion of the vertical semiconductor pattern; and filling a recessed region with a doped semiconductor material, wherein the data storage pattern is formed as a single-layer structure including a ferroelectric material, and the vertical channel pattern is formed of an oxide semiconductor material.

In an embodiment, the method may further include: forming a common source region in the substrate exposed by the separation trench; and forming an insulation spacer covering a sidewall of the separation trench and a common source plug filling an inner space of the separation trench surrounded by the insulation spacer.

In an embodiment, the forming of the vertical channel pattern may include: forming a first portion covering a lower sidewall of the data storage pattern and contacts the substrate; and forming a second portion conformally covering an upper sidewall of the data storage pattern on the first portion.

In an embodiment of the inventive concept, a method for operating a three-dimensional semiconductor device including strings including a data storage pattern having a single-layer structure and including a ferroelectric material, a vertical channel pattern covering a sidewall of the data storage pattern and including an oxide semiconductor material, a conductive pad on an upper surface of the vertical channel pattern, and a vertical semiconductor pattern surrounded by the vertical channel pattern and the conductive pad, selection lines and word lines connected to the strings in a horizontal direction, and bit lines connected to the strings in a vertical direction includes: applying a power supply voltage to a first bit line connected to a target string including a target memory cell in which data is to be stored among the strings; applying a GIDL voltage that is lower than the power supply voltage to at least one of the selection lines connected to the target string; applying a program voltage to a selection word line among the word lines; applying a pass voltage to each of non-selection word lines other than the selection word line among the word lines; inducing GIDL through a voltage difference between the power supply voltage and the GIDL voltage; and injecting and diffusing holes into the vertical channel pattern and the vertical semiconductor pattern corresponding to a channel of the target string.

In an embodiment, the method may further include: applying a voltage that is lower than the power supply voltage to a second bit line connected to a first adjacent string adjacent to the target string; and applying the power supply voltage to at least one of the selection lines connected to a second adjacent string connected to the first bit line, wherein a selective hole injection-based program operation may be performed on the target memory cell.

In an embodiment, the method may further include controlling application timings and values of the power supply voltage, the GIDL voltage, the program voltage, and the pass voltage.

In an embodiment of the inventive concept, an electronic system includes: a three-dimensional semiconductor memory device including a substrate, a stack structure including interlayer dielectric layers and gate electrodes alternately stacked on the substrate, vertical channel structures, which are provided in channel holes penetrating the stack structure and extend in a direction perpendicular to an upper surface of the substrate, and an input/output pad electrically connected to one of the vertical channel structures; and a controller electrically connected to the three-dimensional semiconductor memory device via the input/output pad and configured to control the three-dimensional semiconductor memory device, wherein each of the vertical channel structures includes: a data storage pattern conformally covering an inner sidewall of the channel holes and having a single-layer structure including a ferroelectric material; a vertical channel pattern covering a sidewall of the data storage pattern and including an oxide semiconductor material; a conductive pad on an upper surface of the vertical channel pattern; and a vertical semiconductor pattern surrounded by the vertical channel pattern and the conductive pad, wherein the vertical channel pattern includes a first portion contacting the upper surface of the substrate and a second portion provided between the data storage pattern and the vertical semiconductor pattern, and wherein the vertical semiconductor pattern is spaced apart from the substrate with the first portion of the vertical channel pattern therebetween.

In an embodiment, the vertical semiconductor pattern may include a silicon-based material, the vertical semiconductor pattern may include polysilicon doped with an impurity of a first conductivity type, the conductive pad may include a semiconductor material doped with an impurity of a second conductivity type different from the first conductivity type, the data storage pattern may include at least one of $HfO_x$ having an orthorhombic crystal structure, or PZT $(Pb(Zr, Ti)O_3)$, $PTO(PbTiO_3)$, $SBT(SrBi_2Ti_2O_3)$, $BLT(Bi(La, Ti)O_3)$, $PLZT(Pb(La, Zr)TiO_3)$, $BST(Bi(Sr, Ti)O_3)$, barium titanate $(BaTiO_3)$, P(VDF-TrFE), PVDF, $AlO_xZnO_x$, $TiO_x$, $TaO_x$, or $InO_x$, doped with at least one of Al, Zr, or Si, and the vertical channel pattern may include an oxide semiconductor material or group-IV semiconductor material including at least one of In, Zn, or Ga.

In an embodiment, at least a portion of the conductive pad may overlap an uppermost one among the gate electrodes in a horizontal direction.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
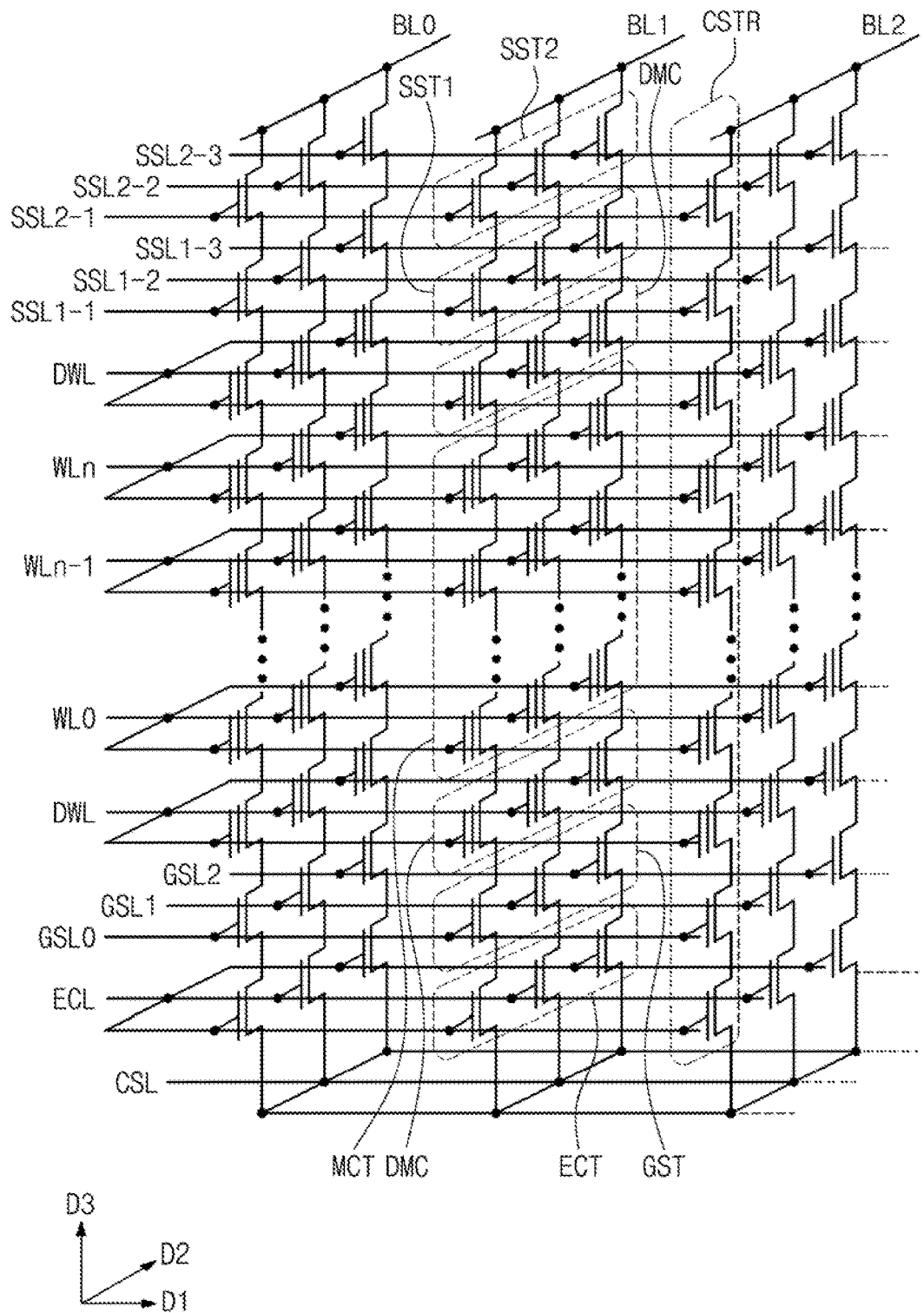
FIG. 1 is a schematic circuit diagram illustrating a cell array of a three-dimensional semiconductor memory device according to embodiments of the inventive concept.

Hereinafter, embodiments of the inventive concept will be described with reference to the accompanying drawings so that the configuration and effects of the inventive concept are sufficiently understood.

The inventive concept is not limited to the embodiments described below, but may be implemented in various forms and may allow various changes and modifications. Rather, the embodiments are provided so that this disclosure will be thorough and complete, and will fully convey the scope of the inventive concept to those skilled in the art. In the accompanying drawings, the scale ratios among elements may be exaggerated or reduced for convenience.

The terminology used herein is not for limiting the invention but for describing particular embodiments. Furthermore, the terms used herein may be interpreted as the meanings known in the art unless the terms are defined differently.

The terms of a singular form may include plural forms unless otherwise specified. It will be further understood that the terms "includes", "including", "comprises", and/or "comprising", when used in this specification, specify the presence of stated elements, steps, operations, and/or components, but do not preclude the presence or addition of one or more other elements, steps, operations, components, and/or groups thereof.

The terms "first", "second", and the like are used herein to describe various regions, directions, shapes, etc., but these regions, directions, and shapes should not be limited by these terms. These terms are only used to distinguish one region, direction, or shape from another region, direction, or shape. Therefore, a part referred to as a first part in an embodiment may be referred to as a second part in another embodiment. The embodiments described herein also include complementary embodiments thereof. Like reference numerals refer to like elements throughout.

Hereinafter, a three-dimensional semiconductor memory device, a method for manufacturing the same, a method for operating the same, and an electronic system including the same according to embodiments of the inventive concept will be described with reference to the drawings.

FIG. 1 is a schematic circuit diagram illustrating a cell array of a three-dimensional semiconductor memory device according to embodiments of the inventive concept.

Referring to FIG. 1, the cell array of the three-dimensional semiconductor memory device according to the inventive concept may include a common source line CSL, a plurality of bit lines BL0, BL1, and BL2, and a plurality of cell strings CSTR provided between the common source line CSL and the bit lines BL0, BL1, and BL2.

The cell strings CSTR may be two-dimensionally arranged in a first direction D1 and a second direction D2 intersecting the first direction D1. For example, the second direction D2 may be perpendicular to the first direction D1. Each of the cell strings CSTR may extend in a third direction D3. For example, the third direction D3 may be perpendicular to the first direction D1 and the second direction D2. The bit lines BL0, BL1, and BL2 may be spaced apart in the first direction D1. Each of the bit lines BL0, BL1, and BL2 may extend in the second direction D2.

The plurality of cell strings CSTR may be connected in parallel to each of the bit lines BL0, BL1, and BL2. The plurality of cell strings CSTR may be commonly connected to the common source line CSL. The plurality of cell strings CSTR may be provided between one common source line CSL and the plurality of bit lines BL0, BL1, and BL2. The common source line CSL may be provided in plurality. The plurality of common lines CSL may be arranged two-dimensionally. The same voltage may be applied to the common source lines CSL, or each of the common source lines CSL may be electrically controlled.

According to embodiments, each of the cell strings CSTR may include first and second string selection transistors SST1 and SST2 connected in series, memory cell transistors MCT connected in series, a ground selection transistor GST, and an erase control transistor ECT. Furthermore, each of the memory cell transistors MCT may include a data storage element.

For example, each of the cell strings CSTR may include the first and second string selection transistors SST1 and SST2 connected in series, and the second string selection transistor SST2 may be connected to one of the bit lines BL0, BL1, and BL2. Alternatively, each of the cell strings CSTR may include one string selection transistor. For another example, in each of the cell strings CSTR, the ground selection transistor GST may include a plurality of MOS transistors connected in series similarly to the first and second string selection transistors SST1 and SST2.

One cell string CSTR may include a plurality of memory cell transistors MCT having different distances to the common source lines CSL. The memory cell transistors MCT may be connected in series between the first string selection transistor SST1 and the ground selection transistor GST. The erase control transistor ECT may be connected between the ground selection transistor GST and the common source lines CSL. Each of the cell strings CSTR may further include dummy cell transistors DMC connected between the first string selection transistor SST1 and an uppermost memory cell transistor among the memory cell transistors MCT and between the ground selection transistor GST and a lowermost memory cell transistor among the memory cell transistors MCT.

According to embodiments, the first string selection transistor SST1 may be controlled by first string selection lines SSL1-1, SSL1-2, and SSL1-3, and the second string selection transistor SST2 may be controlled by second string selection lines SSL2-1, SSL2-2, and SSL2-3. The memory cell transistors MCT may be controlled by a plurality of word lines WL0 to WLn respectively, and the dummy cell transistors DMC may be controlled by dummy word lines DWL respectively. The ground selection transistor GST may be controlled by ground selection lines GSL0, GSL1, and GSL2, and the erase control transistor ECT may be controlled by an erase control line ECL. The erase control transistor ECT may be provided in plurality. The common source lines CSL may be commonly connected to sources of the erase control transistors ECT.

Gate electrodes of the memory cell transistors MCT, which are provided at substantially the same distance from the common source lines CSL, may be commonly connected to one of the word lines WL0 to WLn and DWL and may be in an equipotential state. Alternatively, although the gate electrodes of the memory cell transistors MCT are provided at substantially the same level from the common source lines CSL, gates electrodes arranged on different rows or columns may be independently controlled.

The ground selection lines GSL0, GSL1, and GSL2, the first string selection lines SSL1-1, SSL1-2, and SSL1-3, and the second string selection lines SSL2-1, SSL2-2, and SSL2-3 may extend in the first direction D1 and may be spaced apart in the second direction D2. The ground selection lines GSL0, GSL1, GSL2, the first string selection lines SSL1-1, SSL1-2, and SSL1-3, and the second string selection lines SSL2-1, SSL2-2, and SSL2-3, which are provided at substantially the same level from the common source lines CSL, may be electrically separated from each other. Furthermore, the erase control transistors ECT of different cell strings CSTR may be controlled by the common erase control line ECL. The erase control transistors ECT may cause a gate induced drain leakage (GIDL) during an erase operation of a memory cell array. In some embodiments, during the erase operation of a memory cell array, an erase voltage may be applied to the bit lines BL0, BL1, and BL2 and/or the common source lines CSL, and a gate induced current leakage may occur in the string selection transistor SST and/or the erase control transistors ECT.

Figure 2:
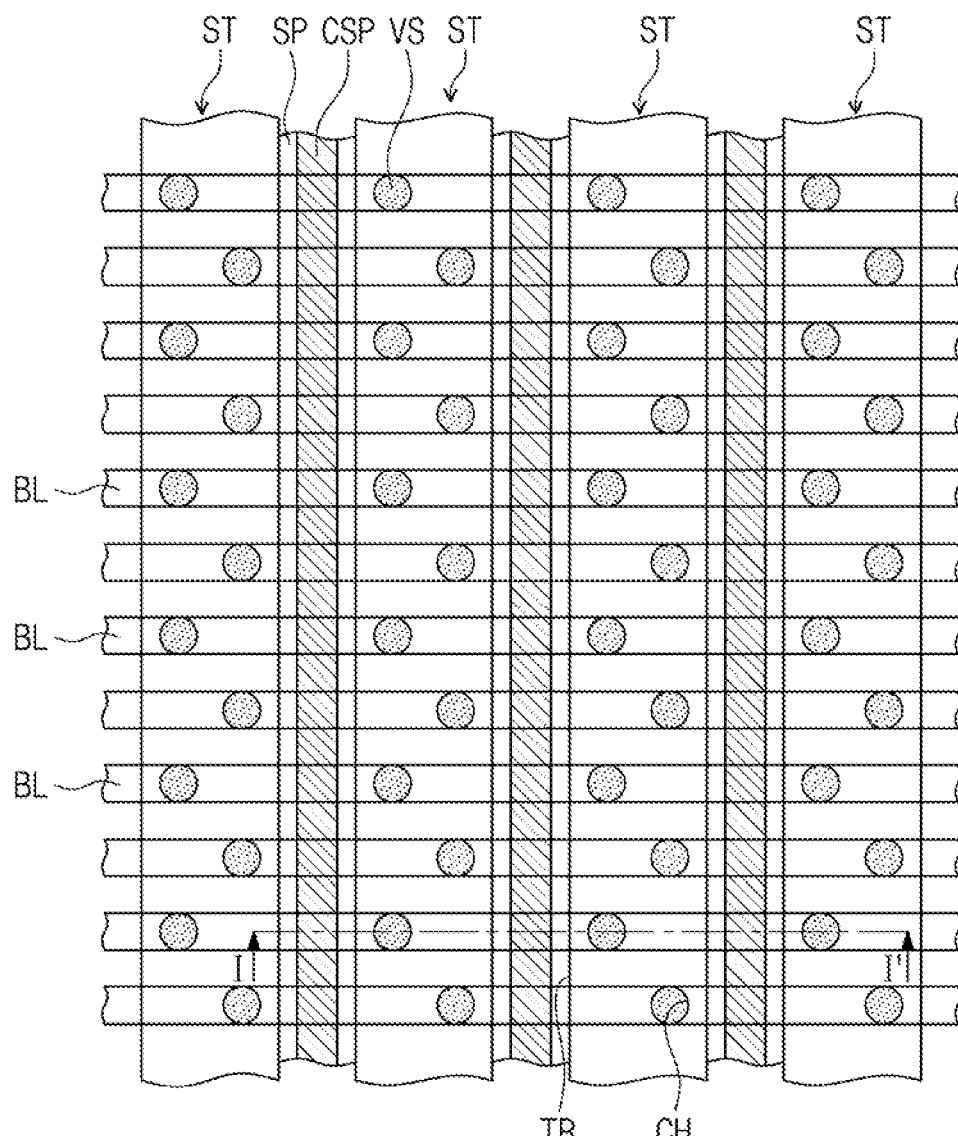
FIG. 2 is a plan view illustrating a three-dimensional semiconductor memory device according to embodiments of the inventive concept.
Figure 2:
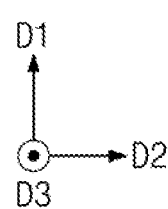
Figure 3:
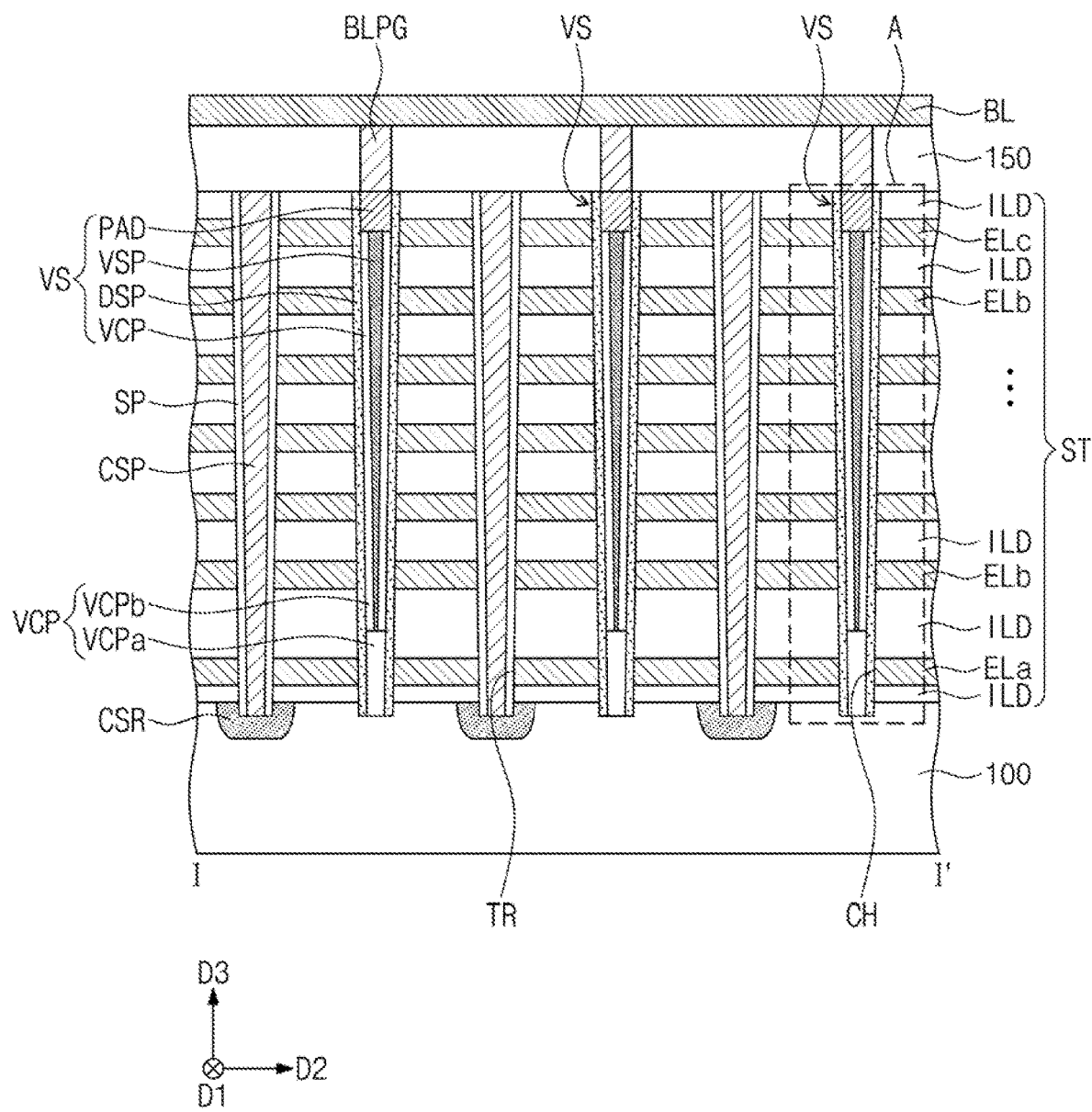
FIG. 3 is a cross-sectional view of the three-dimensional semiconductor memory device according to embodiments of the inventive concept taken along line I-I' of FIG. 2.

FIG. 2 is a plan view illustrating a three-dimensional semiconductor memory device according to embodiments of the inventive concept. FIG. 3 is a cross-sectional view of the three-dimensional semiconductor memory device according to embodiments of the inventive concept taken along line I-I' of FIG. 2.

Referring to FIGS. 2 and 3, stack structures ST may be arranged on a substrate 100. The stack structures ST may extend side by side in the first direction D1. The stack structures ST may be arranged in the second direction D2 and spaced apart from each other in the second direction D2. The substrate 100 may be a semiconductor substrate doped with impurities. The substrate 100 may be a semiconductor substrate doped with a first-conductivity type (for example, P-type) impurity. The substrate 100 may be, for example, a monocrystalline epitaxial layer grown on a silicon substrate, silicon-germanium substrate, germanium substrate, or monocrystalline silicon substrate.

Each of the stack structures ST may include gate electrodes ELa, ELb, and ELc and interlayer dielectric layers ILD alternately stacked in the third direction D3 perpendicular to an upper surface of the substrate 100. The stack structures ST may have a substantially flat upper surface. The upper surfaces of the stack structures ST may be parallel to the upper surface of the substrate 100.

Referring back to FIG. 1, each of the gate electrodes ELa, ELb, and ELc may be one of the erase control line ECL, the ground selection lines GSL0, GSL1, and GSL2, the word lines WL0 to WLn and DWL, the first string selection lines SSL1-1, SSL1-2, and SSL1-3, and the second string selection lines SSL2-1, SSL2-2, and SSL2-3, which are sequentially stacked on the substrate 100. Each of the gate electrodes ELa, ELb, and ELc may have substantially the same thickness in the third direction D3. Hereinafter, a thickness may refer to a thickness in the third direction D3. The gate electrodes ELa, ELb, and ELc may include, for example, at least one selected from among a doped semiconductor (e.g., doped silicon or the like), metal (e.g., tungsten, copper, aluminum, or the like), conductive metal nitride (e.g., titanium nitride, tantalum nitride, or the like), and transition metal (e.g., titanium, tantalum, or the like).

In detail, the gate electrodes ELa, ELb, and ELc may include a lowermost first gate electrode ELa, an uppermost third gate electrode ELc, and a plurality of second gate electrodes ELb between the first gate electrode ELa and the third gate electrode ELc. Although each of the first gate electrode ELa and the third gate electrode ELc is illustrated and described as singular, an embodiment of the inventive concept is not limited thereto, and thus the first gate electrode ELa and the third gate electrode ELc may be provided in plurality as necessary.

Although not illustrated, end portions of the stack structures ST may have a stepwise structure in the first direction D1. In more detail, lengths of the gate electrodes ELa, ELb, and ELc of the stack structures ST in the direction D1 may decrease in a direction away from the substrate 100. The third gate electrode ELc may have a smallest length in the first direction D1, and may have a largest separation distance from the substrate 100 in the third direction D3. The first gate electrode ELa may have a largest length in the first direction D1, and may have a smallest separation distance from the substrate 100 in the third direction D3. Due to the stepwise structure, thicknesses of the stack structures ST may decrease in a direction away from an outermost one among the vertical channel structures VS described below, and, in a plan view, sidewalls of the gate electrodes ELa, ELb, and ELc may be spaced a fixed distance apart in the first direction D1.

The interlayer dielectric layers ILD may have different thicknesses. For example, a lowermost one and uppermost one among the interlayer dielectric layers ILD may have thinner thicknesses than those of the other interlayer dielectric layers ILD. However, this is merely an example and an embodiment of the inventive concept is not limited thereto, and thus the interlayer dielectric layers ILD may have different thicknesses, which may vary according to characteristics of a semiconductor device. The interlayer dielectric layers ILD may include, for example, a silicon oxide.

A plurality of channel holes CH, which penetrate a portion of the substrate 100 and the stack structures ST, may be provided. The vertical channel structures VS may be provided in the channel holes CH. A portion of each of the vertical channel structures VS may be buried in the substrate 100, and lower surfaces of the vertical channel structures VS may be positioned at a lower level than the upper surface of the substrate 100. The vertical channel structures VS may be connected to the substrate 100.

A plurality of columns of the vertical channel structures VS penetrating one of the stack structures ST may be provided. For example, as illustrated in FIG. 2, two columns of the vertical channel structures VS may penetrate one of the stack structures ST. However, an embodiment of the inventive concept is not limited thereto, and, thus, three or more columns of the vertical channel structures VS may penetrate one of the stack structures ST. With regard to a pair of neighboring columns, the vertical channel structures VS corresponding to one column may be shifted in the first direction D1 from the vertical channel structures VS corresponding to the other column. In a plan view, the vertical channel structures VS may be arranged in a zigzag form in the first direction D1.

Each of the vertical channel structures VS may have a cylindrical shape with a major axis extending from the substrate 100 in the third direction D3. Widths of each of the vertical channel structures VS in the first direction D1 and in the second direction D2, for example, may increase in the third direction D3. An upper surface of each of the vertical channel structures VS may have a circular, elliptical, or bar shape.

Each of the vertical channel structures VS may include a data storage pattern DSP, a vertical channel pattern VCP, a vertical semiconductor pattern VSP, and a conductive pad PAD. In each of the vertical channel structures VS, the data storage pattern DSP may have a pipe shape of a macaroni shape whose bottom end is opened, and the vertical channel pattern VSP may have a pipe shape of a macaroni shape whose bottom end is closed. The vertical semiconductor pattern VSP may fill a space surrounded by the vertical channel pattern VCP and the conductive pad PAD.

The data storage pattern DSP may cover an inner wall of each of the channel holes CH, and may contact the sidewalls of the gate electrodes ELa, ELb, and ELc. The data storage pattern DSP may have a single-layer structure including a ferroelectric material. The data storage pattern DSP, for example, may include at least one of $HfO_x$ having an orthorhombic crystal structure, or PZT(Pb(Zr, Ti)$O_3$), PTO (PbTi$O_3$), SBT(SrBi$_2$Ti$_2$O$_3$), BLT(Bi(La, Ti)$O_3$), PLZT(Pb (La, Zr)Ti$O_3$), BST(Bi(Sr, Ti)$O_3$), barium titanate (BaTi$O_3$), P(VDF-TrFE), PVDF, $AlO_x$, $ZnO_x$, $TiO_x$, $TaO_x$, or $InO_x$ doped with at least one of Al, Zr, or Si. The data storage pattern DSP may indicate a binary data value by virtue of a voltage change due to a polarization phenomenon.

The vertical channel pattern VCP may cover a sidewall of the data storage pattern DSP. The vertical channel pattern VCP may include a first portion VCPa and a second portion VCPb on the first portion VCPa.

The first portion VCPa of the vertical channel pattern VCP may be provided to a lower portion of each of the channel holes CH, and may contact the substrate 100. A thickness of the first portion VCPa of the vertical channel pattern VCP, for example, may be larger than a thickness of the first gate electrode ELa. A sidewall of the first portion VCPa of the vertical channel pattern VCP may be surrounded by the data storage pattern DSP. An upper surface of the first portion VCPa of the vertical channel pattern VCP may be positioned at a higher level than an upper surface of the first gate electrode ELa. In more detail, the upper surface of the first portion VCPa of the vertical channel pattern VCP may be positioned between the upper surface of the first gate electrode ELa and a lower surface of a lowermost one among the second gate electrodes ELb. A lower surface of the first portion VCPa of the vertical channel pattern VCP may be positioned at a lower level than an uppermost surface (i.e., the lower surface of the lowermost one among the interlayer dielectric layers ILD) of the substrate 100. A portion of the first portion VCPa of the vertical channel pattern VCP may overlap the first gate electrode ELa in a horizontal direction. Hereinafter, a horizontal direction refers to any direction extending in the first direction D1 and the second direction D2 in a plan view.

The second portion VCPb of the vertical channel pattern VCP may extend in the third direction D3 from the upper surface of the first portion VCPa. The second portion VCPb of the vertical channel pattern VCP may be provided between the data storage pattern DSP and the vertical semiconductor pattern VSP. An upper surface of the second portion VCPb of the vertical channel pattern VCP may be substantially coplanar with an upper surface of the vertical semiconductor pattern VSP. The upper surface of the second portion VCPb of the vertical channel pattern VCP may be positioned at a higher level than the upper surface of the uppermost one among the second gate electrodes ELb. In more detail, the upper surface of the second portion VCPb of the vertical channel pattern VCP may be positioned between the upper surface and lower surface of the third gate electrode ELc.

The vertical channel pattern VCP may include an oxide semiconductor material capable of blocking, suppressing, or minimizing a current leakage. The vertical channel pattern VCP may include an oxide semiconductor material or group-IV semiconductor material including at least one of In, Zn, or Ga having excellent current leakage characteristics. The vertical channel pattern VCP, for example, may include a $ZnO_x$-based material including Ag—ZnO or the like or AZO, ZTO, IZO, ITO, or IGZO.

The vertical channel pattern VCP may block, suppress, or minimize a current leakage to the gate electrodes ELa, ELb, and ELc or the substrate 100, and may improve transistor characteristics (e.g., threshold voltage distribution and program/read operation speed) of at least one of the gate electrodes ELa, ELb, or ELc. Accordingly, electrical characteristics of the three-dimensional semiconductor memory device according to an embodiment of the inventive concept may be improved.

The vertical semiconductor pattern VSP may be surrounded by the second portion VCPb of the vertical channel pattern VCP. The upper surface of the vertical semiconductor pattern VSP may contact the conductive pad PAD, and a lower surface of the vertical semiconductor pattern VSP may contact the first portion VCPa of the vertical channel pattern VCP. The vertical semiconductor pattern VSP may be spaced apart from the substrate 100 in the third direction D3. In other words, the vertical semiconductor pattern VSP may be electrically floated from the substrate 100.

The vertical semiconductor pattern VSP may include a silicon-based material capable of diffusing holes. The vertical semiconductor pattern VSP, for example, may include a semiconductor material doped with impurities, intrinsic semiconductor material undoped with impurities, or polycrystalline semiconductor material. For example, the vertical semiconductor pattern VSP may include polysilicon doped with a first-conductivity type (for example, P-type) impurity that is the same as that of the substrate 100.

The vertical semiconductor pattern VSP may have excellent hole mobility, and thus may assist with hole injection and diffusion by GIDL in at least one of the gate electrodes ELa, ELb, or ELc. Due to the vertical semiconductor pattern VSP, holes may be more easily transferred to the vertical channel pattern VCP. That is, the vertical semiconductor pattern VSP may enable hole injection-based memory operation, and, thus, the electrical characteristics of the three-dimensional semiconductor memory device according to an embodiment of the inventive concept may be improved.

Referring back to FIG. 1, the vertical channel structures VS may correspond to channels of the erase control transistor ECT, the first and second string selection transistors SST1 and SST2, the ground selection transistor GST, and the memory cell transistor MCT.

The conductive pad PAD may be provided on the upper surface of the second portion VCPb of the vertical channel pattern VCP and the upper surface of the vertical semiconductor pattern VSP. The conductive pad PAD may be connected to an upper portion of the vertical channel pattern VCP and an upper portion of the vertical semiconductor pattern VSP. A sidewall of the conductive pad PAD may be surrounded by the data storage pattern DSP. An upper surface of the conductive pad PAD may be substantially coplanar with the upper surface (i.e., the upper surface of the uppermost one among the interlayer dielectric layers ILD) of each of the stack structures ST. A lower surface of the conductive pad PAD may be positioned at a lower level than the upper surface of the third gate electrode ELc. In more detail, the lower surface of the conductive pad PAD may be positioned between the upper surface and lower surface of the third gate electrode ELc. That is, at least a portion of the conductive pad PAD may overlap the third gate electrode ELc in a horizontal direction.

The conductive pad PAD may include a semiconductor or conductive material doped with impurities. The conductive pad PAD, for example, may include a semiconductor material doped with an impurity of a second conductivity type (e.g., N-type) different from that (specifically the first conductivity type (e.g., P-type)) of the vertical semiconductor pattern VSP.

The conductive pad PAD may reduce contact resistance between the vertical channel pattern VCP (or vertical semiconductor pattern VSP) and the bit line BL described below. The conductive pad PAD may supply holes to the vertical semiconductor pattern VSP.

A separation trench TR extending in the first direction D1 between neighboring stack structures ST may be provided. A common source region CSR may be provided in the substrate 100 exposed by the separation trench TR. The common source region CSR may extend in the first direction D1 in the substrate 100. The common source region CSR may include a semiconductor material doped with an impurity of the second conductivity type (e.g., N-type) different from the first conductivity type. The common source region CSR may correspond to the common source line CSL of FIG. 1.

A common source plug CSP may be provided in the separation trench TR. The common source plug CSP may be connected to the common source region CSR. An upper surface of the common source plug CSP may be substantially coplanar with the upper surface (i.e., the upper surface of the uppermost one among the interlayer dielectric layers ILD) of each of the stack structures ST. The common source plug CSP may have a shape of a plate extending in the first direction D1 and the third direction D3. A width of the common source plug CSP in the second direction D2, for example, may increase in the third direction D3.

Insulation spacers SP may be interposed between the common source plug CSP and the stack structures ST. The insulation spacers SP may face each other between neighboring stack structures ST. The insulation spacers SP may include, for example, silicon oxide, silicon nitride, silicon oxynitride, or low-k material with low dielectric constant.

A capping insulation film 150 may be provided on the stack structures ST, the vertical channel structures VS, and the common source plug CSP. The capping insulation film 150 may cover the upper surface of the uppermost one among the interlayer dielectric layers ILD, the upper surface of the conductive pad PAD, and the upper surface of the common source plug CSP. The capping insulation film 150, for example, may include an insulation material that is different from that of the interlayer dielectric layers ILD. A bit line contact plug BPLG electrically connected to the conductive pad PAD may be provided in the capping insulation film 150. Widths of the bit line contact plug BPLG in the first direction D1 and in the second direction D2, for example, may increase in the third direction D3.

The bit line BL may be provided on the capping insulation film 150 and the bit line contact plug BPLG. The bit line BL may extend in the second direction D2. The bit line BL may be electrically connected to the vertical channel structures VS via the bit line contact plug BPLG. The bit line BL and the bit line contact plug BPLG may include a conductive material. The bit line BL may correspond to any one of the plurality of bit lines BL0, BL1, and BL2 of FIG. 1.

Figure 4:
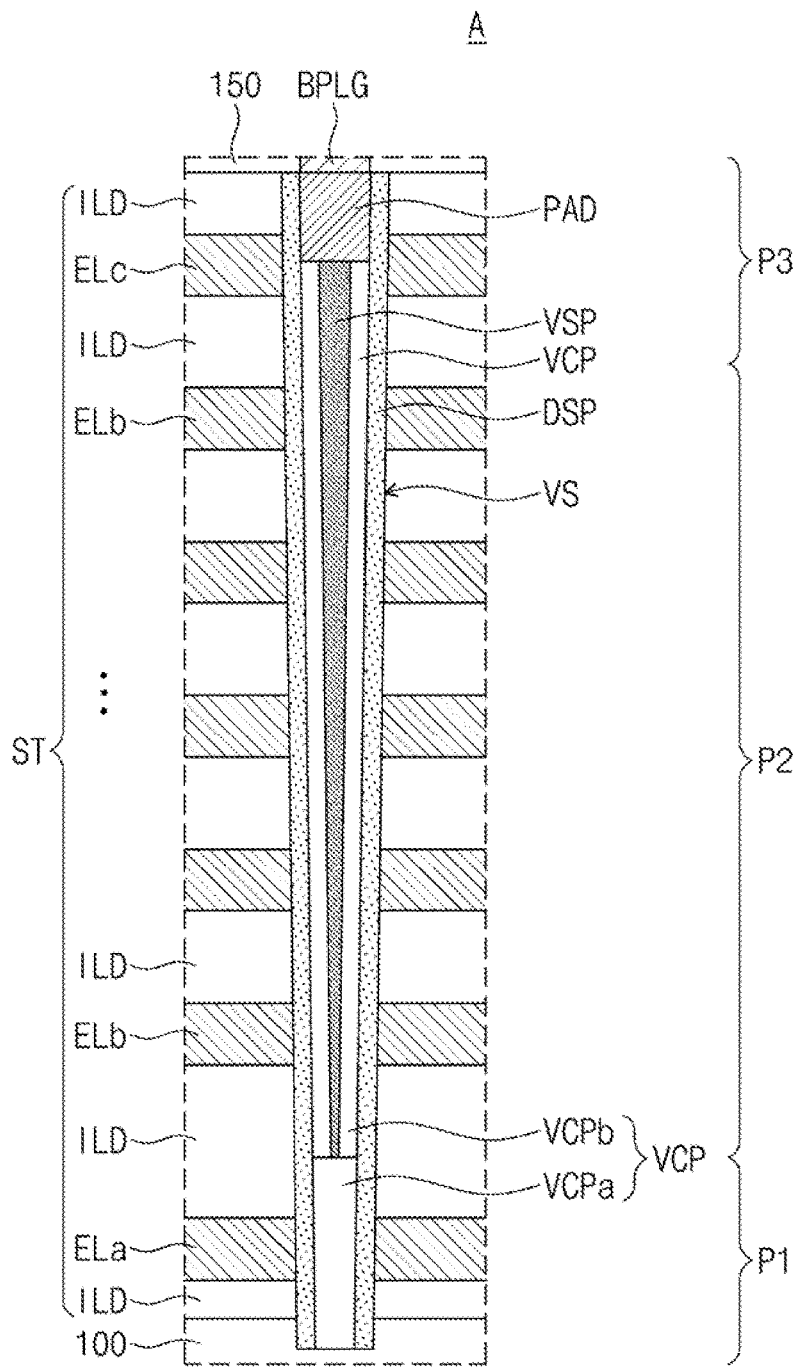
FIG. 4 is an enlarged view of a portion, which corresponds to the portion A of FIG. 3, of the three-dimensional semiconductor memory device according to embodiments of the inventive concept.
Figure 4:
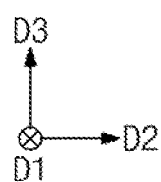

FIG. 4 is an enlarged view of a portion, which corresponds to the portion A of FIG. 3, of the three-dimensional semiconductor memory device according to embodiments of the inventive concept.

Referring to FIGS. 3 and 4, each of the vertical channel structures VS of the three-dimensional semiconductor memory device according to the inventive concept may include a first portion P1, a third portion P3 on the first portion P1, and a second portion P2 between the first portion P1 and the third portion P3.

The first portion P1 of each of the vertical channel structures VS may include the first portion VCPa of the vertical channel pattern VCP, and may overlap the first gate electrode ELa in a horizontal direction. The first gate electrode ELa, for example, may correspond to any one of the ground selection lines GSL0, GSL1, and GSL2 of FIG. 1. The first portion P1 of each of the vertical channel structures VS may block, suppress, or minimize a current leakage through the first portion VCPa of the vertical channel pattern VCP.

The second portion P2 of each of the vertical channel structures VS may include the data storage pattern DSP, the vertical channel pattern VCP, and the vertical semiconductor pattern VSP extending in the third direction D3, and may overlap the second gate electrodes ELb in a horizontal direction. Each of the second gate electrodes ELb, for example, may correspond to any one of the word lines WL0 to WLn and DWL of FIG. 1.

As described below, holes supplied from the bit line BL may be injected through the vertical semiconductor pattern VSP and may be diffused into the vertical channel pattern VCP. A polarization phenomenon may occur in the data storage pattern DSP due to a difference between a voltage generated due to the holes diffused into the vertical channel pattern VCP and a voltage of one of the second gate electrodes ELb. Accordingly, data may be stored in the data storage pattern DSP, and a program operation of the three-dimensional semiconductor memory device according to the inventive concept may be performed.

The third portion P3 of each of the vertical channel structures VS may include the conductive pad PAD electrically connected to the bit line BL via the bit line contact plug BPLG, and may overlap the third gate electrode ELc in a horizontal direction. The third gate electrode ELc, for example, may correspond to any one of the first string selection lines SSL1-1, SSL1-2, and SSL1-3 or any one of the second string selection lines SSL2-1, SSL2-2, and SSL2-3 of FIG. 1.

GIDL may occur due to a difference between a voltage of the bit line BL and a voltage of the third gate electrode ELc, and, accordingly, holes may be supplied from the bit line BL to the conductive pad PAD and further to the vertical semiconductor pattern VSP and the vertical channel pattern VCP.

Figure 5:
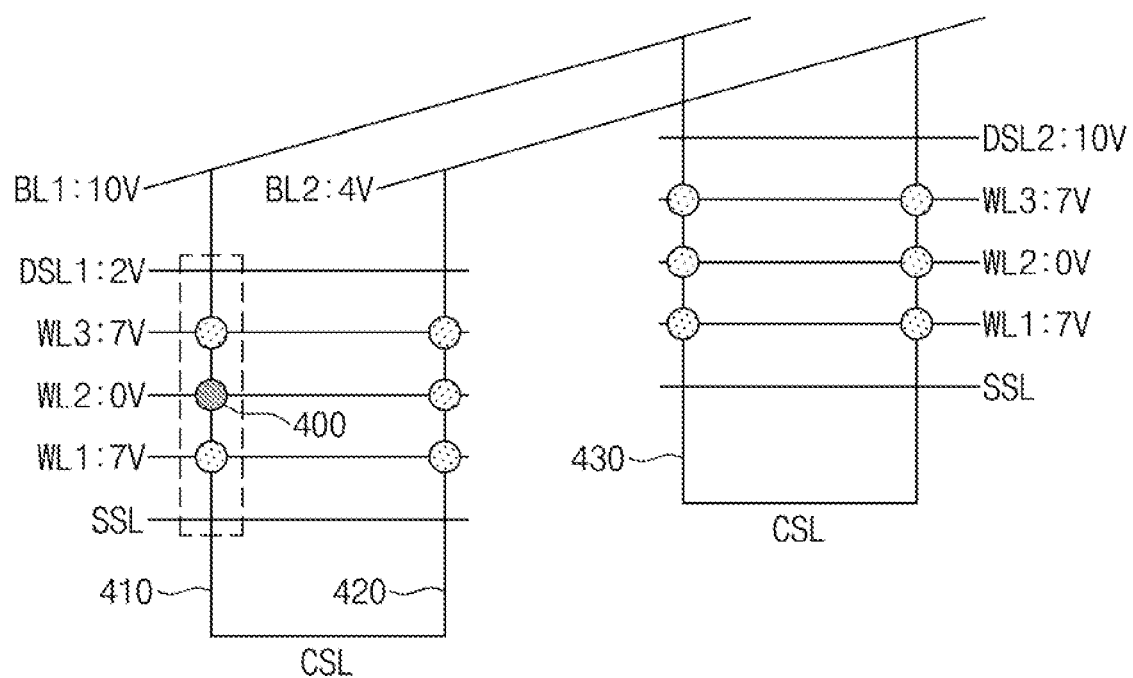
FIG. 5 is a schematic circuit diagram for describing a method for operating of a three-dimensional semiconductor memory device according to embodiments of the inventive concept.

FIG. 5 is a schematic circuit diagram for describing a method for operating of a three-dimensional semiconductor memory device according to embodiments of the inventive concept. The method for operating of a three-dimensional semiconductor memory device according to embodiments of the inventive concept will be described with reference to FIG. 5.

Referring to FIGS. 3, 4, and 5, the three-dimensional semiconductor memory device according to the inventive concept may perform a hole injection-based program operation for at least one string on the basis of holes being injected and diffused into the vertical semiconductor pattern VSP and the vertical channel pattern VCP due to GIDL according to voltages respectively applied to at least one selection line and one of the bit lines BL1 and BL2 on a string.

Hereinafter, at least one string including a target memory cell 400, on which the hole injection-based program operation is to be performed, may be referred to as a target string 410. A word line corresponding to the target memory cell 400 among the plurality of word lines WL1, WL2, and WL3 may be referred to as a selection word line WL2, and word lines corresponding to memory cells other than the target memory cell 400 among the plurality of word lines WL1, WL2, and WL3 may be referred to as non-selection word lines WL1 and WL3. The plurality of word lines WL1, WL2, and WL3 may correspond to the second gate electrodes ELb of FIGS. 3 and 4, and the number of the word lines WL1, WL2, and WL3 is an example, and an embodiment of the inventive concept is not limited thereto. A drain selection line provided on the word lines WL1, WL2, and WL3 may be referred to as at least one selection line DSL1 or DSL2, and may correspond to the third gate electrode ELc of FIGS. 3 and 4. The source selection line SSL and common source line CSL provided under the word lines WL1, WL2, and WL3 may be electrically floated, and may respectively correspond to the first gate electrode ELa and the common source region CSR of FIGS. 3 and 4. The plurality of word lines WL1, WL2, and WL3, the source selection line SSL, and the common source line CSL may be connected to strings in a horizontal direction, and the bit lines BL1 and BL2 may be connected to strings in a vertical direction.

In more detail, the method for operating a three-dimensional semiconductor memory device according to the inventive concept may include applying a power supply voltage (e.g., 10 V) to the bit line BL1 of the target string 410 including the target memory cell 400, applying a GIDL voltage (e.g., 2 V) that is lower than the power supply voltage to at least one selection line DSL1 connected to the target string 410, applying a program voltage (e.g., 0 V) to the selection word line WL2, and applying a pass voltage (e.g., 7 V) to each of the non-selection word lines WL1 and WL3.

The method for operating a three-dimensional semiconductor memory device according to the inventive concept may further include inducing GIDL through a voltage difference between the bit line BL1 and at least one selection line DSL1, injecting and diffusing holes into a channel of the target string 410, and performing a selective hole injection-based program operation on the target memory cell 400. The channel of the target string 410 may correspond to the vertical semiconductor pattern VSP and the vertical channel pattern VCP of FIGS. 3 and 4.

The three-dimensional semiconductor memory device according to the inventive concept may control a voltage applied to the bit line BL2 of a first adjacent string 420 (a string that shares at least one selection line DSL1 with the target string 410) and a voltage applied to at least one selection line DSL2 of a second adjacent string 430 (a string that shares the bit line BL1 with the target string 410) to thereby perform the selective hole injection-based program operation for injecting holes only into the target string 410 without injecting holes into the first adjacent string 420 and the second adjacent string 430.

For example, the three-dimensional semiconductor memory device according to the inventive concept may not allow holes to be injected into the first adjacent string 420 by not inducing GIDL between at least one selection line DSL1 and the bit line BL2 of the first adjacent string 420 by applying a voltage (a voltage which is not significantly different from the GIDL voltage applied to at least one selection line DLS1, for example, 4 V) lower than the power supply voltage to the bit line BL2 of the first adjacent string 420. Accordingly, as described above, the three-dimensional semiconductor memory device according to the inventive concept may allow holes to be injected and diffused only into the channel of the target string 410 by inducing GIDL only between at least one selection line DSL1 and the bit line BL1 of the target string 410, and, in this manner, may perform the selective hole injection-based program operation on the target string 410 including the target memory cell 400.

For another example, the three-dimensional semiconductor memory device according to the inventive concept may not allow holes to be injected into the second adjacent string 430 by not inducing GIDL between at least one selection line DSL2 and the bit line BL1 of the second adjacent string 430 by applying the power supply voltage (a voltage which is significantly different from the GIDL voltage applied to at least one selection line DLS1 of the target string 410, for example, 10 V) to at least one selection line DSL2 connected to the second adjacent string 430. Accordingly, as described above, the three-dimensional semiconductor memory device according to the inventive concept may allow holes to be injected and diffused only into the channel of the target string 410 by inducing GIDL only between at least one selection line DSL1 and the bit line BL1 of the target string 410, and, in this manner, may perform the selective hole injection-based program operation on the target string 410 including the target memory cell 400.

In order to perform the selective hole injection-based program operation on the target string 410 (more specifically, the target memory cell 400) as described above, the method for operating a three-dimensional semiconductor memory device according to the inventive concept may further include controlling application timings and values of a power supply voltage applied to the bit line BL1 of the target string 410, a GIDL voltage applied to at least one selection line DSL1 connected to the target string 410, a program voltage applied to the selection word line WL2, a pass voltage applied to each of the non-selection word lines WL1 and WL3, a voltage applied to the bit line BL2 of the first adjacent string 420, and a power supply voltage applied to at least one selection line DSL2 connected to the second adjacent string 430.

In other words, the three-dimensional semiconductor memory device according to the inventive concept may implement the selective hole injection-based program operation for the target string 410 including the target memory cell 400 by controlling voltages applied to not only the target string 410 but also the adjacent strings 420 and 430 while applying a voltage so as to induce GIDL between at least one selection line DSL1 and the bit line BL1 of the target string 410. Although only the hole injection-based program operation has been described, hole injection-based read and erase operations may be performed on the basis of the same principle.

FIGS. 6 to 11 are cross-sectional views, which correspond to cross-sections along line I-I' of FIG. 2, for describing a method for manufacturing a three-dimensional semiconductor memory device according to embodiments of the inventive concept.

The method for manufacturing a three-dimensional semiconductor memory device according to the inventive concept may include: forming a mold structure including interlayer dielectric layers and sacrificial films alternately stacked on a substrate; forming channel holes penetrating the mold structure; forming vertical channel structures in the channel holes; forming a separation trench having a line shape and extending in one direction while penetrating the mold structure; selectively removing the sacrificial films exposed by the separation trench; forming gate electrodes filling spaces in which the sacrificial films have been removed; forming a common source region in the substrate exposed by the separation trench; and forming an insulation spacer covering a sidewall of the separation trench and a common source plug filling an inner space of the separation trench surrounded by the insulation spacer. Hereinafter, the method for manufacturing a three-dimensional semiconductor memory device according to the inventive concept will be described in detail with reference to FIGS. 6 to 11.

Figure 6:
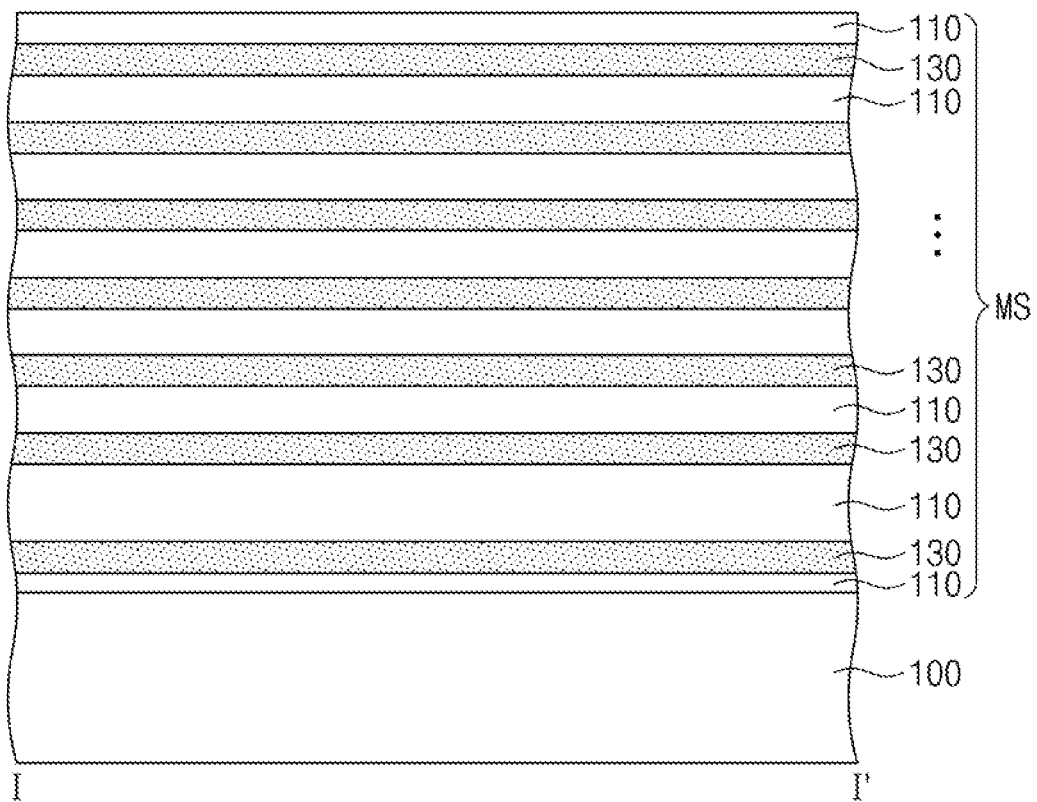
FIGS. 6 to 11 are cross-sectional views, which correspond to cross-sections along line I-I' of FIG. 2, for describing a method for manufacturing a three-dimensional semiconductor memory device according to embodiments of the inventive concept.
Figure 6:
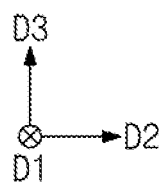

Referring to FIG. 6, a mold structure MS including interlayer dielectric layers 110 and sacrificial films 130 alternately stacked may be formed on the substrate 100. The interlayer dielectric layers 110 and the sacrificial films 130, for example, may be formed using a chemical vapor deposition method. However, a lowermost one among the interlayer dielectric layers 110 disposed between the substrate 100 and a lowermost one among the sacrificial films 130 may be formed through a thermal oxidation process after a deposition process. The interlayer dielectric layers 110 may correspond to the interlayer dielectric layers ILD of FIG. 3.

The sacrificial films 130 of the mold structure MS may include a material having etching selectivity for the interlayer dielectric layers 110. For example, the sacrificial films 130 may include a silicon nitride, and the interlayer dielectric layers 110 may include a silicon oxide.

Figure 7:
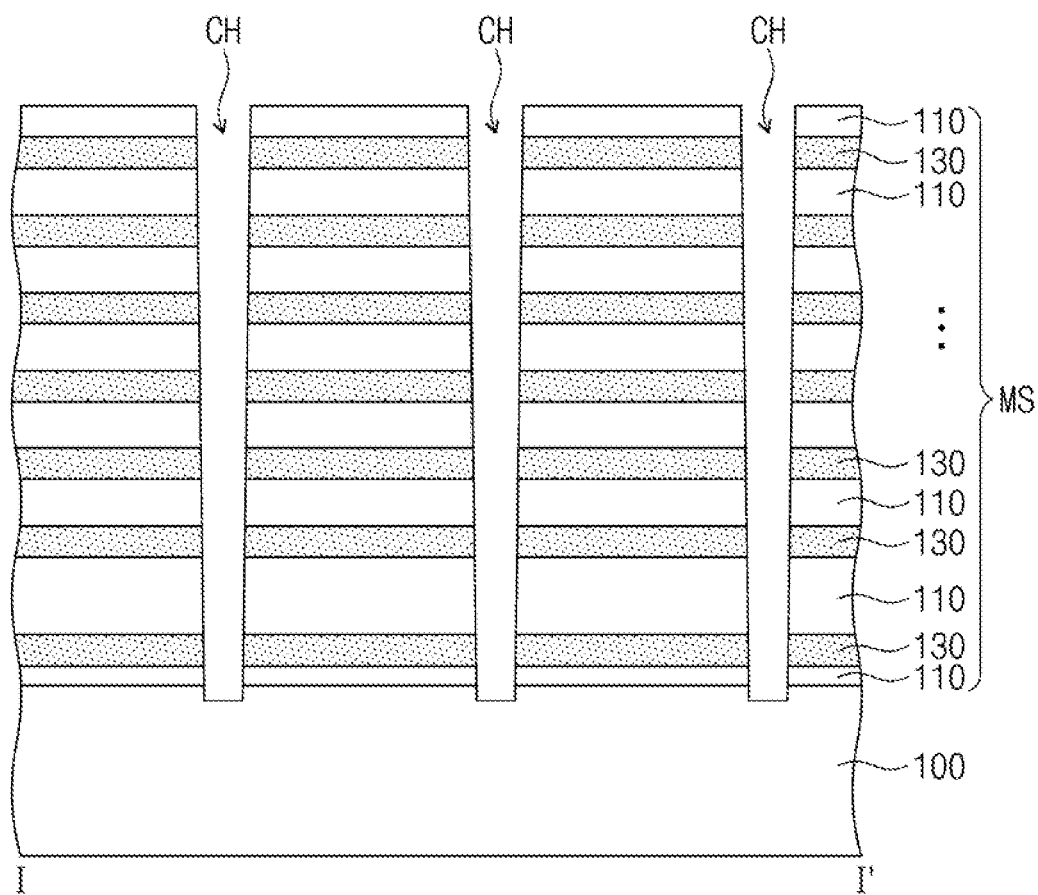

Referring to FIG. 7, channel holes CH penetrating the mold structure MS may be formed. The channel holes CH may recess a portion of the substrate 100, and may expose the upper surface of the substrate 100. The channel holes CH may expose sidewalls of the interlayer dielectric layers 110 and the sacrificial films 130.

The channel holes CH may be formed by forming a mask pattern on the mold structure MS and performing an anisotropic etching process using the mask pattern as an etching mask. The upper surface of the substrate 100 may be over-etched due to the anisotropic etching process. The channel holes CH may have a plurality of columns and may be arranged in a zigzag form in the plan view of FIG. 2.

Figure 8:
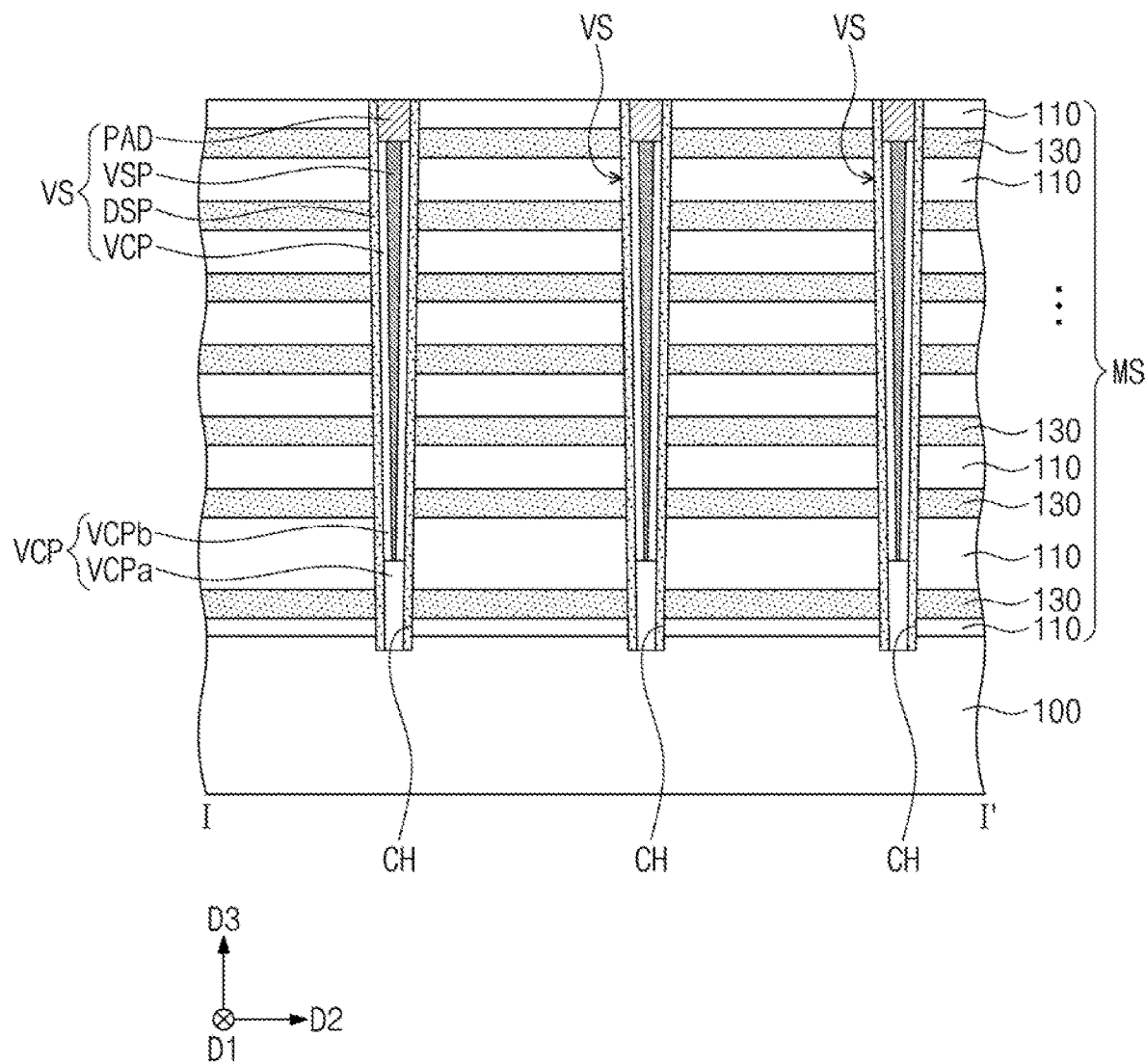

Referring to FIG. 8, the vertical channel structures VS may be formed in the channel holes CH. Forming each of the vertical channel structures VS may include: forming the data storage pattern DSP conformally covering an inner sidewall of each of the channel holes CH; forming the vertical channel pattern VCP partially covering a sidewall of the data storage pattern DSP; forming the vertical semiconductor pattern VSP filling a space surrounded by the vertical channel pattern VCP; and forming the conductive pad PAD filling a space surrounded by a portion of the sidewall of the data storage pattern DSP, an upper surface of the vertical channel pattern VCP, and an upper surface of the vertical semiconductor pattern VSP.

In more detail, forming the vertical channel pattern VCP may include: forming the first portion VCPa that covers a lower sidewall of the data storage pattern DSP and contacts the substrate 100; and forming the second portion VCPb conformally covering an upper sidewall of the data storage pattern DSP on the first portion VCPa.

Although not illustrated, forming each of the vertical channel structures VS may further include forming a buried insulation pattern VI (see FIG. 13) filling a space surrounded by the vertical semiconductor pattern VSP and the conductive pad PAD.

The data storage pattern DSP may be formed as a single-layer structure including a ferroelectric material. The data storage pattern DSP, for example, may be formed of at least one of $HfO_x$ having an orthorhombic crystal structure, or $PZT(Pb(Zr, Ti)O_3)$, $PTO(PbTiO_3)$, $SBT(SrBi_2Ti_2O_9)$, $BLT(Bi(La, Ti)O_3)$, $PLZT(Pb(La, Zr)TiO_3)$, $BST(Bi(Sr, Ti)O_3)$, barium titanate $(BaTiO_3)$, $P(VDF-TrFE)$, PVDF, $AlO_x$, $ZnO_x$, $TiO_x$, $TaO_x$, or $InO_x$ doped with at least one of Al, Zr, or Si.

The vertical channel pattern VCP may be formed of an oxide semiconductor material or group-IV semiconductor material including at least one of In, Zn, or Ga. The vertical channel pattern VCP, for example, may be formed of a $ZnO_x$-based material including Ag—ZnO or the like or AZO, ZTO, IZO, ITO, or IGZO.

The vertical semiconductor pattern VSP may be formed of a silicon-based material. The vertical semiconductor pattern VSP, for example, may be formed of a semiconductor material doped with impurities, intrinsic semiconductor material undoped with impurities, or polycrystalline semiconductor material.

The data storage pattern DSP, the vertical channel pattern VCP, and the vertical semiconductor pattern VSP may be formed using a chemical vapor deposition method or atomic layer deposition method. The conductive pad PAD, for example, may be formed by recessing an upper portion of the vertical channel pattern VCP and an upper portion of the vertical semiconductor pattern VSP and filling a recessed region with a doped semiconductor material or conductive material.

Figure 9:
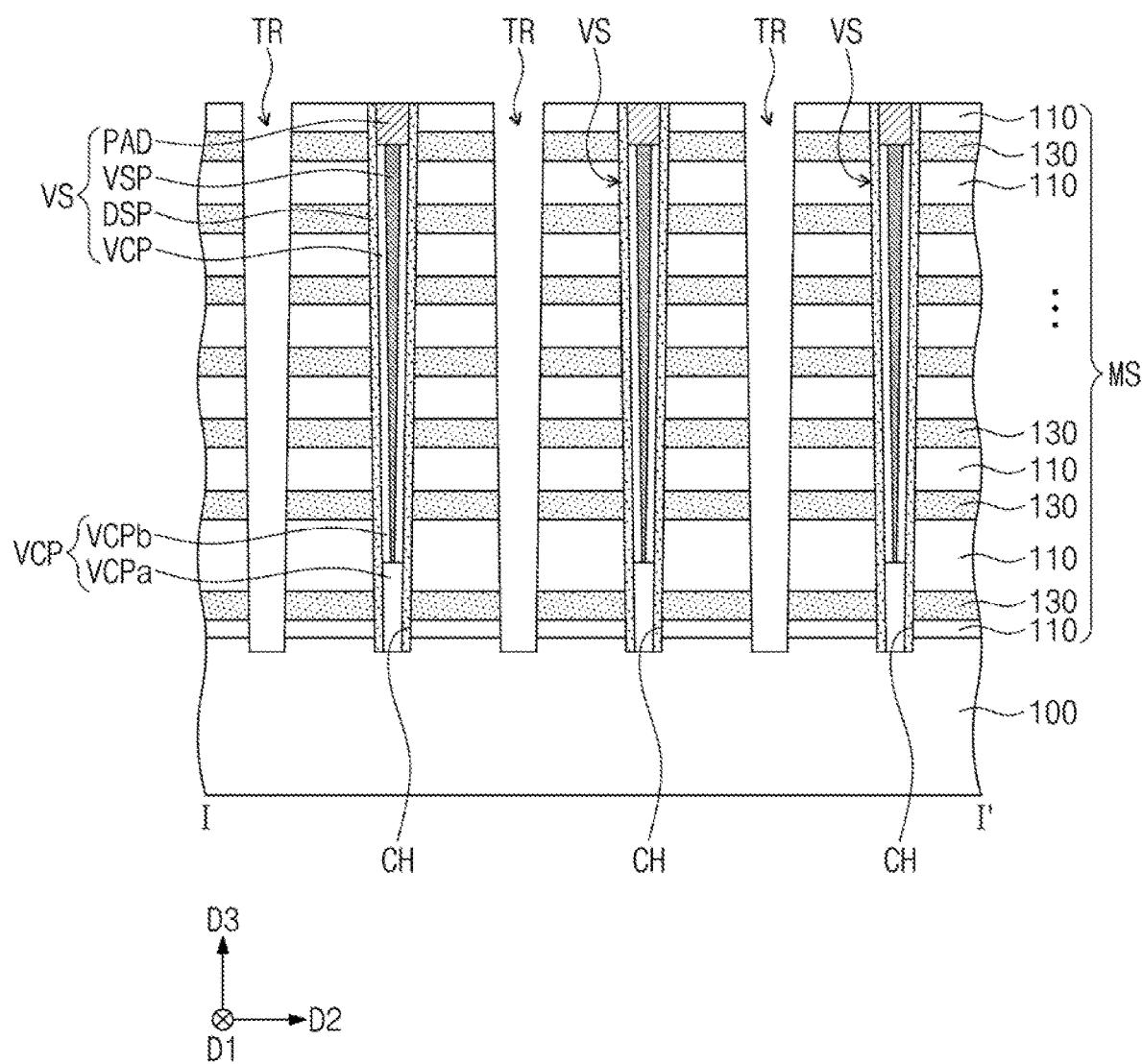

Referring to FIG. 9, the separation trench TR penetrating the mold structure MS may be formed. The separation trench TR may be spaced apart from the vertical channel structures VS in a horizontal direction. The separation trench TR may recess a portion of the substrate 100, and may expose the upper surface of the substrate 100. The separation trench TR may expose sidewalls of the interlayer dielectric layers 110 and the sacrificial films 130.

The separation trench TR may be formed by forming a mask pattern on the mold structure MS and patterning the mold structure MS using the mask pattern as an etching mask. The upper surface of the substrate 100 may be over-etched due to the patterning. The separation trench TR may have a shape of a line extending in the first direction D1 in the plan view of FIG. 2.

Figure 10:
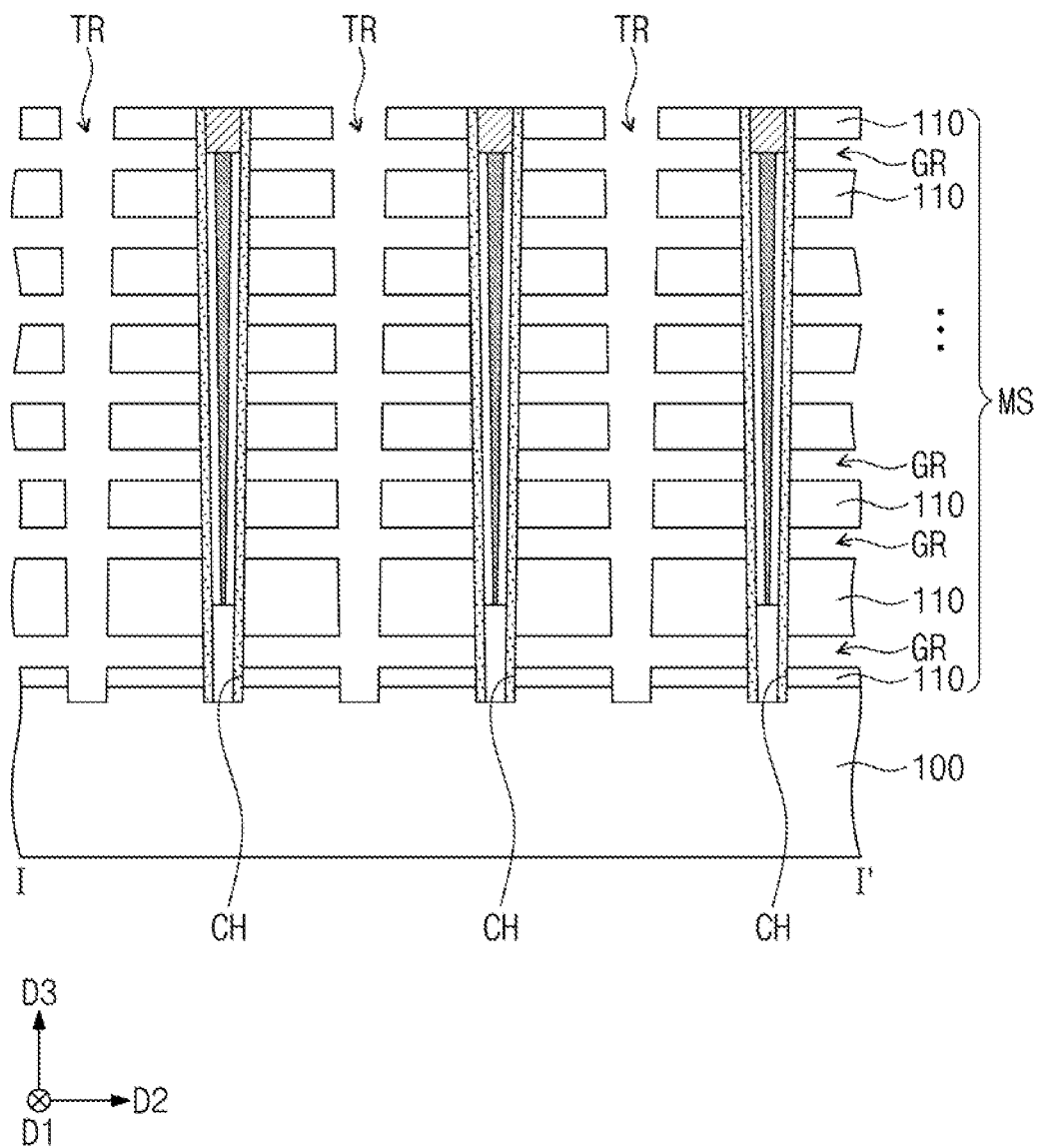

Referring to FIG. 10, the sacrificial films 130 exposed by the separation trench TR may be selectively removed. Selectively removing the sacrificial films 130 may be performed through a wet etching process using an etching solution. For example, the sacrificial films 130 may be selectively removed by an etching solution including hydrofluoric acid or phosphoric acid.

Spaces in which the sacrificial films 130 have been removed may be referred to as gate regions GR. The gate regions GR may be defined as regions extending horizontally from the separation trench TR to a space between the interlayer dielectric layers 110.

Figure 11:
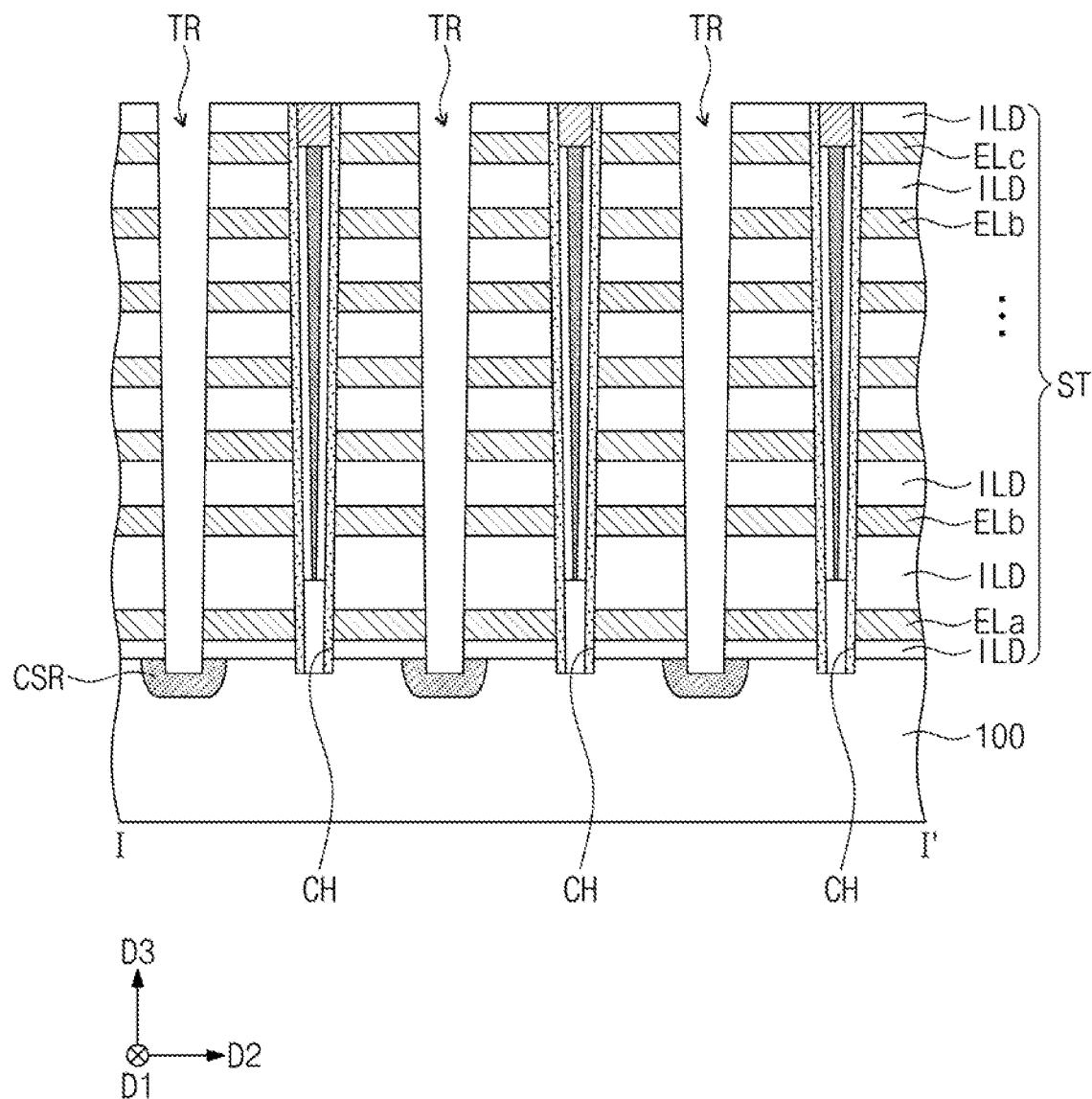

Referring to FIG. 11, the gate electrodes ELa, ELb, and ELc filling the gate regions GR may be formed. The gate electrodes ELa, ELb, and ELc may be formed by forming a conductive film filling a portion of the separation trench TR and the gate regions GR and removing the conductive film formed in the separation trench TR. The gate electrodes ELa, ELb, and ELc, for example, may be formed using a chemical vapor deposition method or atomic layer deposition method.

Since the gate electrodes ELa, ELb, and ELc are formed, the stack structures ST including the gate electrodes ELa, ELb, and ELc and the interlayer dielectric layers ILD alternately stacked in the third direction D3 and perpendicular to the upper surface of the substrate 100 may be formed. In the plan view of FIG. 2, the stack structures ST may extend in the first direction D1, may be arranged in the second direction D2, and may be spaced apart from each other in the second direction D2. A portion of the upper surface of the substrate 100 may be exposed between neighboring stack structures ST.

The upper surface of the substrate 100 exposed by the separation trench TR may be doped with an impurity that differs in conductivity type from the substrate 100, and, accordingly, the common source region CSR may be formed in the substrate 100 between neighboring stack structures ST.

Referring to FIG. 3, the insulation spacers SP covering a sidewall of the separation trench TR may be formed. The insulation spacers SP may be formed by conformally depositing a spacer film on the substrate 100 and the stack structures ST illustrated in FIG. 11 and exposing the common source region CSR through an etch back process or the like. The common source plug CSP may be formed in an inner space of the separation trench TR surrounded by the insulation spacers SP.

The capping insulation film 150 may be formed on the stack structures ST, the vertical channel structures VS, and the common source plug CSP. The capping insulation film 150 may cover the upper surface of the uppermost one among the interlayer dielectric layers ILD, the upper surface of the conductive pad PAD, and the upper surface of the common source plug CSP. Thereafter, the bit line contact plug BPLG penetrating the capping insulation film 150 and electrically connected to the conductive pad PAD may be formed. Thereafter, the bit line BL extending in the second direction D2 on the capping insulation film 150 and electrically connected to the bit line contact plug BPLG may be formed.

Figure 12:
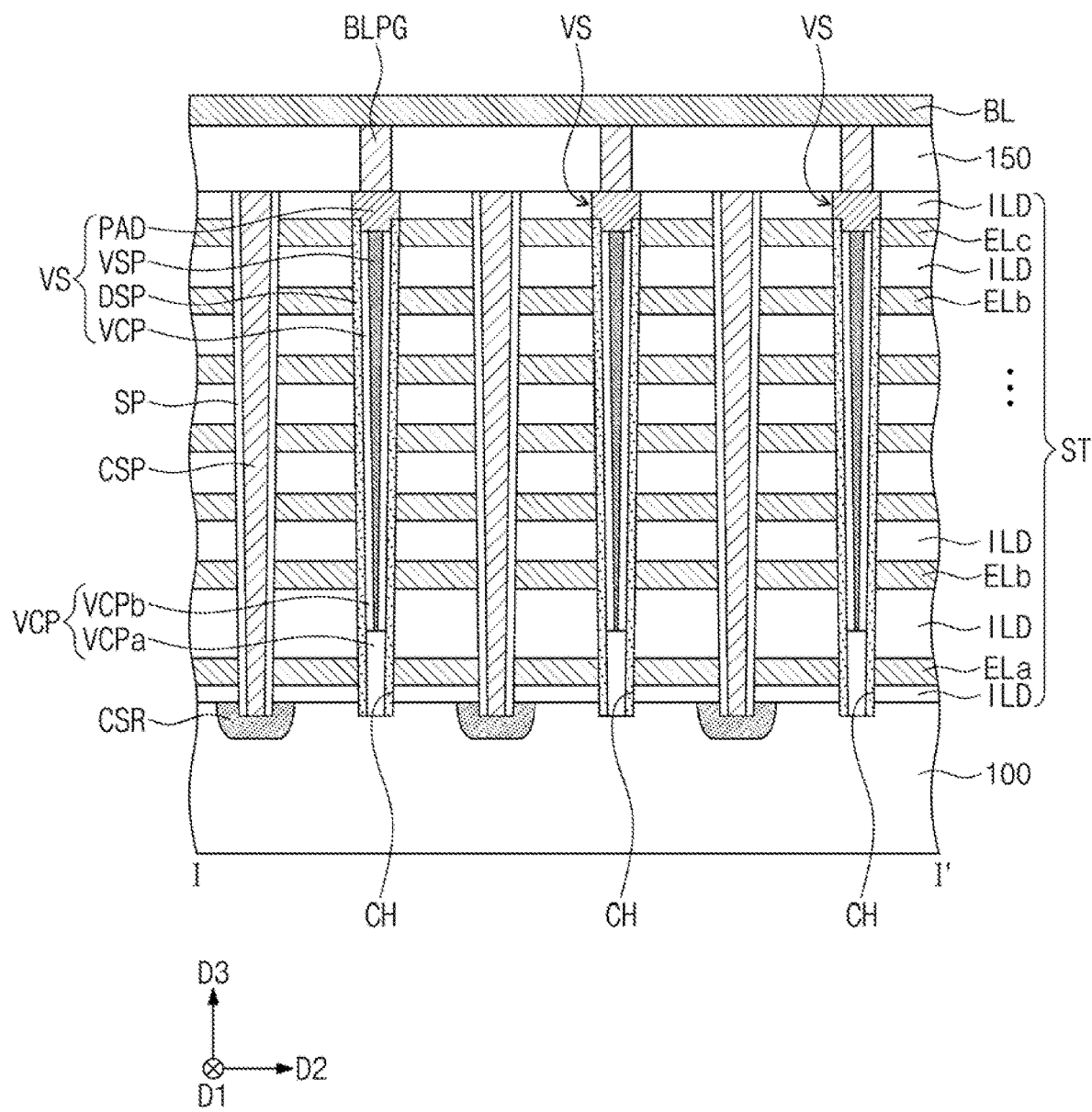
FIGS. 12 to 15 are cross-sectional views of the three-dimensional semiconductor memory device according to embodiments of the inventive concept along line I-I' of FIG. 2.

FIG. 12 is a cross-sectional view of the three-dimensional semiconductor memory device according to embodiments of the inventive concept taken along line I-I' of FIG. 2. Hereinafter, for convenience, descriptions that are substantially the same as those provided above with reference to FIGS. 2 and 3 will not be provided, and differences therebetween will be described in detail.

Referring to FIG. 12, a sidewall of the conductive pad PAD may contact the uppermost one among the interlayer dielectric layers ILD. The conductive pad PAD may have a step at which the width of the conductive PAD in the first direction D1 or in the second direction D2 changes discontinuously. In more detail, a lower portion of the conductive pad PAD positioned at a lower level than the step may be surrounded by the data storage pattern DSP and may contact the upper surface of the vertical channel pattern VCP and the upper surface of the vertical semiconductor pattern VSP, and an upper portion of the conductive pad PAD positioned at a higher level than the step may be surrounded by the uppermost one among the interlayer dielectric layers ILD on the upper surface of the data storage pattern DSP. The lower portion of the conductive pad PAD may overlap the third gate electrode ELc in a horizontal direction. A width of the upper portion of the conductive pad PAD may be larger than a width of the lower portion of the conductive pad PAD.

Figure 13:
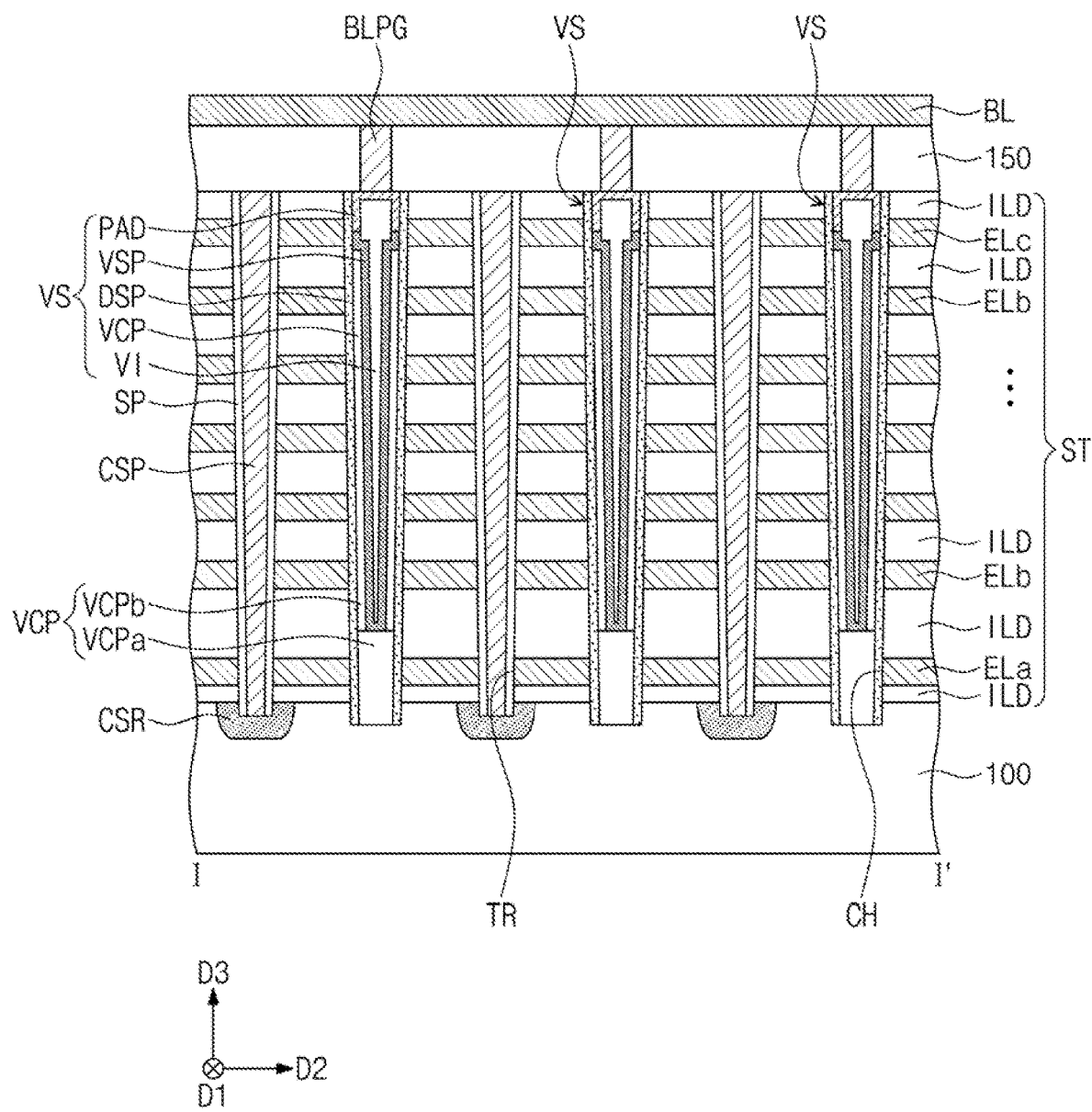

FIG. 13 is a cross-sectional view of the three-dimensional semiconductor memory device according to embodiments of the inventive concept taken along line I-I' of FIG. 2. Hereinafter, for convenience, descriptions that are substantially the same as those provided above with reference to FIGS. 2 and 3 will not be provided, and differences therebetween will be described in detail.

Referring to FIG. 13, each of the vertical channel structures VS may further include the buried insulation pattern VI filling a space surrounded by the vertical semiconductor pattern VSP and the conductive pad PAD. Widths of the buried insulation pattern VI in the first direction D1 and in the second direction D2, for example, may increase in the third direction D3. An upper surface of the buried insulation pattern VI may be positioned at a higher level than the lower surface of the third gate electrode ELc. A lower surface of the buried insulation pattern VI, for example, may be positioned at a lower level that the lower surface of the lowermost one among the second gate electrodes ELb, but an embodiment of the inventive concept is not limited thereto, and, thus, the level of the lower surface of the buried insulation pattern VI may be changed according to widths of each of the vertical channel pattern VCP and the vertical semiconductor pattern VSP in the first direction D1 and in the second direction D2.

The buried insulation pattern VI may have a step at which the width of the buried insulation pattern VI in the first direction D1 or in the second direction D2 changes discontinuously. In more detail, a lower portion of the buried insulation pattern VI positioned at a lower level than the step may be surrounded by the vertical semiconductor pattern VSP, and an upper portion of the buried insulation pattern VI positioned at a higher level than the step may be surrounded by a portion of the vertical semiconductor pattern VSP and the conductive pad PAD. A width of the upper portion of the buried insulation pattern VI may be larger than a width of the lower portion of the buried insulation pattern VI. The buried insulation pattern VI may include an insulation material such as a silicon oxide or the like.

A portion of the vertical semiconductor pattern VSP may extend from a sidewall of the vertical channel pattern VCP along the upper surface of the vertical channel pattern VCP. That is, a portion of the vertical semiconductor pattern VSP may be positioned at a higher level than the upper surface of the vertical channel pattern VCP. Furthermore, another portion of the vertical semiconductor pattern VSP may extend from the upper surface of the vertical channel pattern VCP along a sidewall of the data storage pattern DSP.

The conductive pad PAD may extend from a sidewall of the data storage pattern DSP along the lower surface of the capping insulation film 150. The conductive pad PAD may have a larger thickness at a portion at which the conductive pad PAD contacts the data storage pattern DSP than at a portion at which the conductive pad PAD contacts the lower surface of the capping insulation film 150. At least a portion of the conductive pad PAD may overlap the third gate electrode ELc in a horizontal direction.

Figure 14:
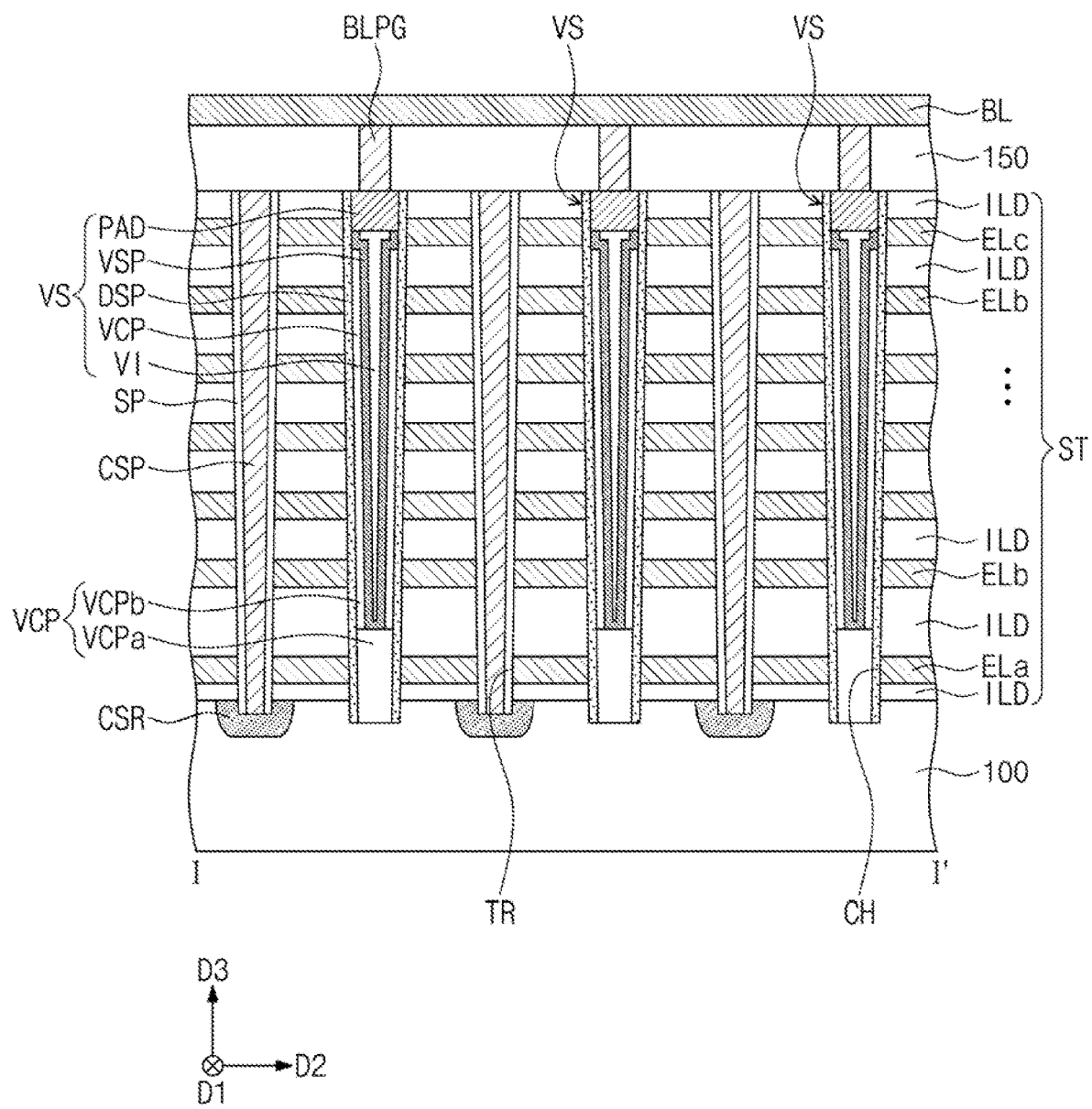

FIG. 14 is a cross-sectional view of the three-dimensional semiconductor memory device according to embodiments of the inventive concept taken along line I-I' of FIG. 2. Hereinafter, for convenience, descriptions that are substantially the same as those provided above with reference to FIGS. 2, 3, and 13 will not be provided, and differences therebetween will be described in detail.

Referring to FIG. 14, the conductive pad PAD may have a uniform thickness. The lower surface of the conductive pad PAD may contact the upper surface of the vertical semiconductor pattern VSP and the upper surface of the buried insulation pattern VI. The upper surface of the vertical semiconductor pattern VSP and the upper surface of the buried insulation pattern VI may be substantially coplanar with each other, and may be positioned at a higher level than the lower surface of the third gate electrode ELc.

Figure 15:
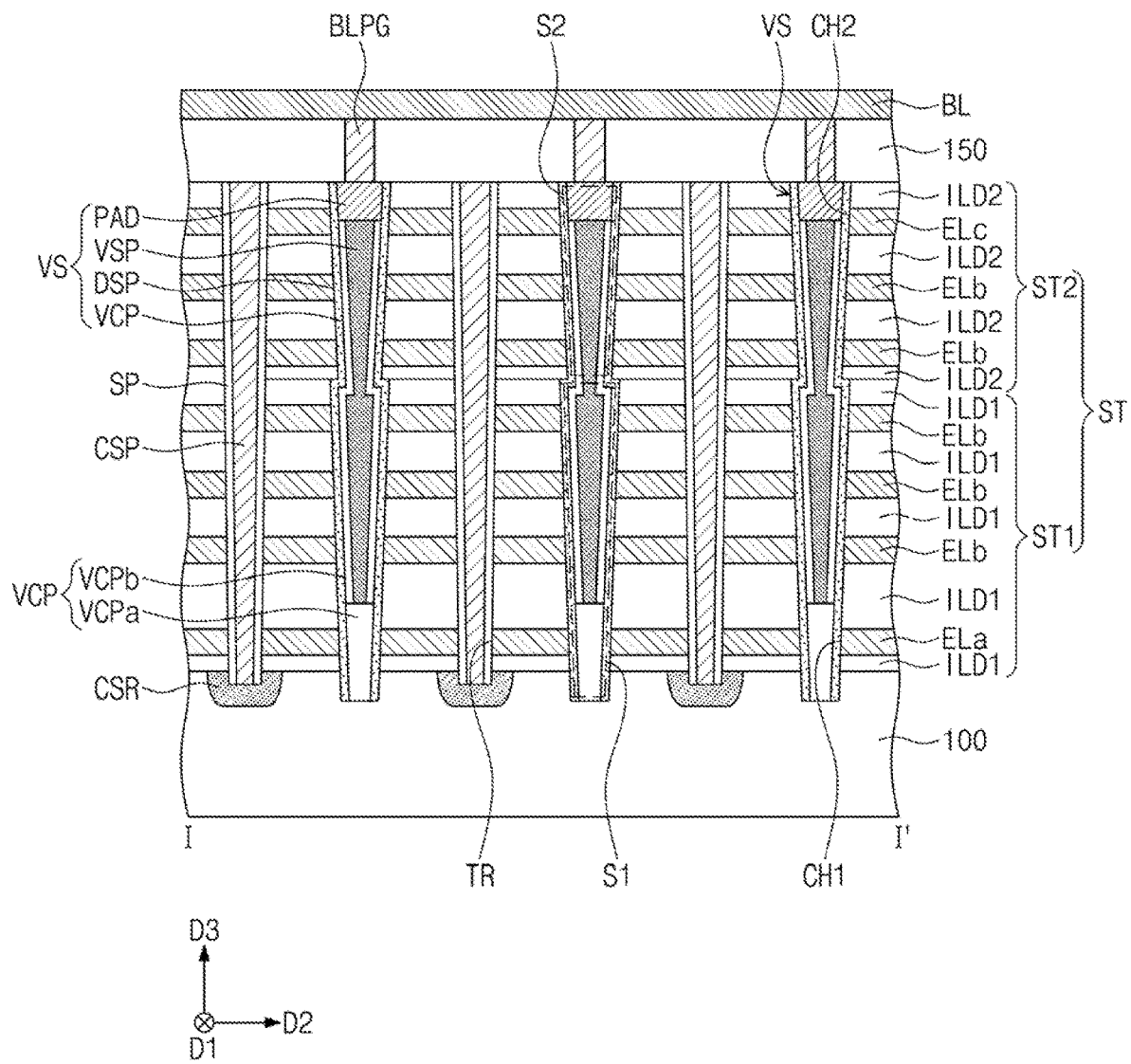

FIG. 15 is a cross-sectional view of the three-dimensional semiconductor memory device according to embodiments of the inventive concept taken along line I-I' of FIG. 2. Hereinafter, for convenience, descriptions that are substantially the same as those provided above with reference to FIGS. 2 and 3 will not be provided, and differences therebetween will be described in detail.

Referring to FIG. 15, each of the plurality of channel holes CH (see FIGS. 2 and 3) penetrating a portion of the substrate 100 and the stack structures ST may include a first channel hole CH1 and a second channel hole CH2. Widths of each of the first and second holes CH1 and CH2 in the first direction D1 and in the second direction D2, for example, may increase in the third direction D3. The first and second channel holes CH1 and CH2 may have different diameters at a boundary at which the first and second channel holes CH1 and CH2 are connected to each other. In more detail, an upper diameter of the first channel hole CH1 may be larger than a lower diameter of the second channel hole CH2. That is, the first and second channel holes CH1 and CH2 may have a step at the boundary therebetween. However, this is merely an example and an embodiment of the inventive concept is not limited thereto, and thus channel holes CH having steps at two or more boundaries may be provided unlike the illustration.

Each of the vertical channel structures VS may include a first structure S1 filling the first channel hole CH1 and a second structure S2 provided on the first structure S1 and filling the second channel hole CH2. Widths of each of the first and second structures S1 and S2 in the first direction D1 and in the second direction D2, for example, may increase in the third direction D3.

Figure 16:
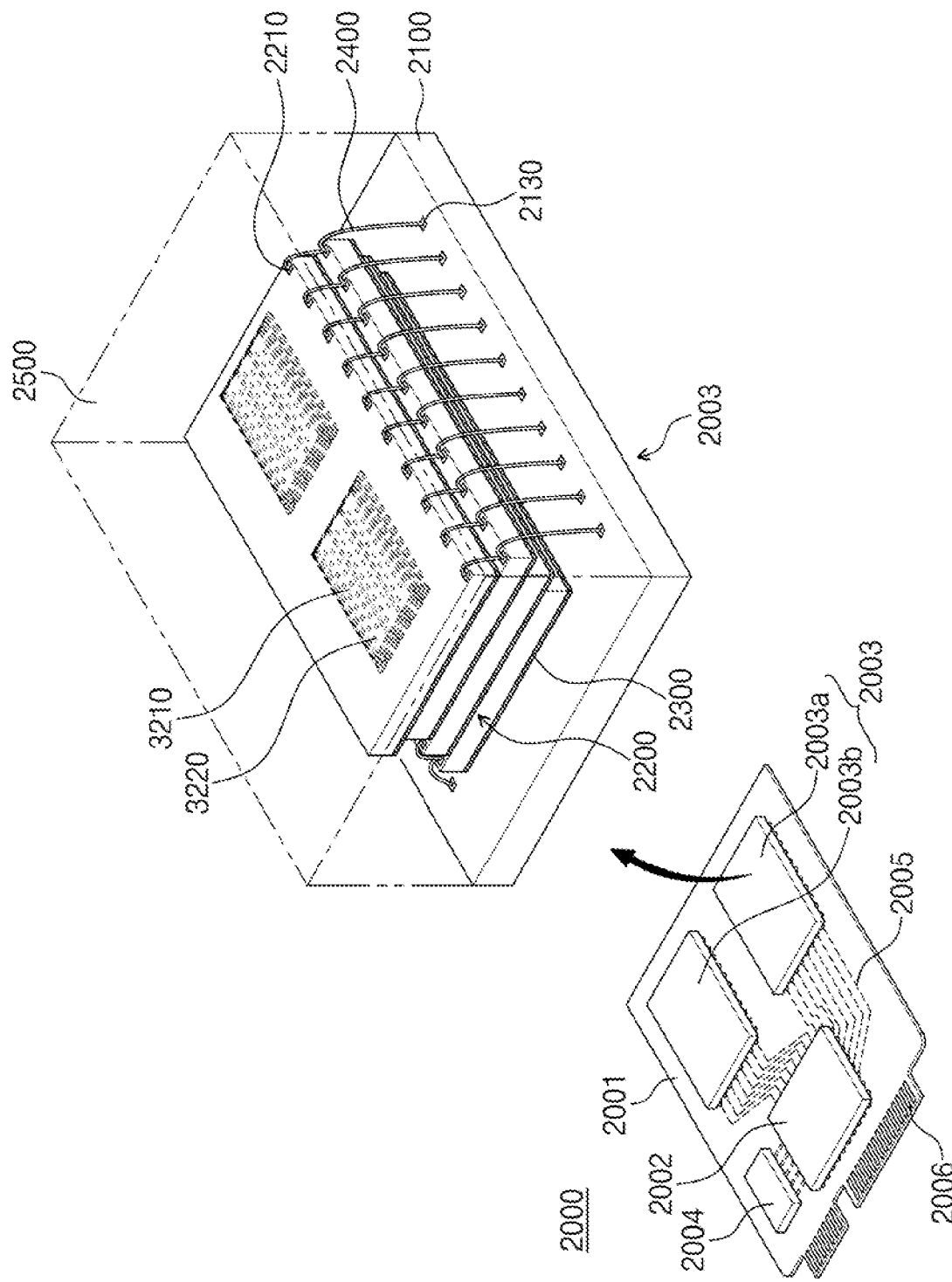
FIG. 16 is a schematic perspective view illustrating an electronic system including a three-dimensional semiconductor memory device according to embodiments of the inventive concept.

FIG. 16 is a schematic perspective view illustrating an electronic system including a three-dimensional semiconductor memory device according to embodiments of the inventive concept.

Referring to FIG. 16, an electronic system 2000 including a three-dimensional semiconductor memory device according the inventive concept may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 by wiring patterns 2005 provided to the main substrate 2001.

The main substrate 2001 may include a connector 2006 with a plurality of pins connected to an external host. The number and arrangement of the plurality of pins of the connector 2006 may be changed according to a communication interface between the electronic system 2000 and an external host. The electronic system 2000, for example, may communicate with an external host according to any one of interfaces such as Universal Serial Bus (USB), Peripheral Component Interconnect Express (PCI-Express), Serial Advanced Technology Attachment (SATA), and M-Phy for Universal Flash Storage (UFS). The electronic system 2000, for example, may be operated using power supplied from an external host via the connector 2006. The electronic system 2000 may further include a power management integrated circuit (PMIC) for distributing power supplied from an external host to the controller 2002 and the semiconductor package 2003.

The controller 2002 may write data to the semiconductor package 2003 or read data from the semiconductor package 2003, and may improve an operation speed of the electronic system 2000.

The DRAM 2004 may be a buffer memory for reducing a speed difference between an external host and the semiconductor package 2003 that is a data storage space. The DRAM 2004 included in the electronic system 2000 may operate as a type of a cache memory, and may provide a space for temporarily storing data during an operation of controlling the semiconductor package 2003. In the case where the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include first and second semiconductor packages 2003 and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 respectively arranged on lower surfaces of the semiconductor chips 2200, connection structures 2400 for electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. Each of the semiconductor chips 2200 may include input/output pads 2210. Each of the semiconductor chips 2200 may include the above-mentioned three-dimensional semiconductor memory device. In more detail, each of the semiconductor chips 2200 may include gate stack structures 3210 and memory channel structures 3220. The gate stack structures 3210 may correspond to the above-mentioned stack structures ST (see FIGS. 2 and 3), and the memory channel structures 3220 may correspond to the above-mentioned vertical channel structures VS (see FIGS. 2 and 3).

The connection structures 2400, for example, may be bonding wires for electrically connecting the input/output pads 2210 to the package upper pads 2130. Therefore, in each of the first and second semiconductor packages 2003a and 2003b, the semiconductor chips 2200 may be electrically connected to each other through bonding wires and electrically connected to the package upper pads 2130 of the package substrate 2100. Depending on embodiments, in each of the first and second semiconductor packages 2003a and 2003b, the semiconductor chips 2200 may be electrically connected to each other by through-silicon via instead of the connection structures 2400 using bonding wires.

The controller 2002 and the semiconductor chips 2200 may be included in a single package unlike the illustration. The controller 2002 and the semiconductor chips 2200 may be mounted on a separate interposer substrate different from the main substrate 2001, and may be connected to each other through wiring provided to the interposer substrate.

The three-dimensional semiconductor memory device according to embodiments of the inventive concept includes a vertical channel pattern that includes a material having excellent current leakage characteristics, and thus may block, suppress, or minimize a current leakage to a substrate or gate electrodes, and may provide improved transistor characteristics (e.g., threshold voltage distribution and program/read operation speed) of at least one of the gate electrodes.

Furthermore, the three-dimensional semiconductor memory device according to embodiments of the inventive concept includes a vertical semiconductor pattern that includes a material having excellent hole mobility, and thus may facilitate hole injection and diffusion due to GIDL in at least one of the gate electrodes.

Furthermore, the method for operating a three-dimensional semiconductor memory device according to embodiments of the inventive concept may perform a selective hole injection-based program operation.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method for operating a three-dimensional semiconductor device comprising strings including a data storage pattern including a ferroelectric material, selection lines, and word lines corresponding to the strings, the method comprising:
    applying a power supply voltage to a first bit line connected to a target string including a target memory cell in which data is to be stored among the strings;
    applying a gate induced drain leakage (GIDL) voltage that is lower than the power supply voltage to a first selection line corresponding to the target string among the selection lines;
    applying a program voltage that is lower than the power supply voltage to a selection word line corresponding to the target memory cell among the word lines, and
    applying a first pass voltage to a first non-selection word line other than the selection word line among the word lines,
    wherein the first pass voltage is different from the program voltage.

2. The method of claim 1, wherein the GIDL voltage is lower than the first pass voltage.

3. The method of claim 1, wherein the strings further include:
    a vertical semiconductor pattern surrounded by a sidewall of the data storage pattern; and
    the method further comprising:
    inducing GIDL through a voltage difference between the power supply voltage and the GIDL voltage; and
    injecting and diffusing holes into the vertical semiconductor pattern corresponding to the target string.

4. The method of claim 1, further comprising:
    applying a second pass voltage to a second non-selection word line being adjacent to the first non-selection word line;
    wherein the second pass voltage is higher than a voltage applied to a second bit line, the second bit line being adjacent to the first bit line.

5. The method of claim 1, wherein the program voltage is lower than the first pass voltage.

6. The method of claim 1, further comprising:
    applying a voltage that is lower than the power supply voltage to a second bit line being adjacent to the first bit line; and
    applying the power supply voltage to a second selection line corresponding to an adjacent string being adjacent to the target string.

7. A method for operating a three-dimensional semiconductor device comprising strings including a data storage pattern including a ferroelectric material, a vertical channel pattern on a sidewall of the data storage pattern, and a vertical semiconductor pattern surrounded by the vertical channel pattern, selection lines and word lines corresponding to the strings, the method comprising:
    applying a first voltage to a first bit line connected to a first string including a first memory cell in which data is to be stored among the strings;
    applying a second voltage to a selection line corresponding to the first string among the selection lines;
    applying a third voltage to a selection word line corresponding to the first memory cell among the word lines; and
    applying a fourth voltage to a first word line corresponding to a second memory cell among the word lines, the second memory cell being immediately adjacent to the first memory cell in the first string;
    wherein the first voltage is different from the third voltage, the first voltage is different from the fourth voltage, and the second voltage is lower than the fourth voltage.

8. The method of claim 7, wherein the third voltage is lower than the fourth voltage.

9. The method of claim 7, wherein the third voltage is lower than the first voltage.

10. The method of claim 7, wherein the third voltage is lower than the second voltage.

11. The method of claim 7, wherein the vertical semiconductor pattern includes an undoped semiconductor pattern.

12. A method for operating a three-dimensional semiconductor device comprising strings including a data storage pattern including a ferroelectric material, selection lines, and word lines connected to the strings, the method comprising:
    applying a first voltage to a first bit line connected to a first string including a first memory cell in which data is to be stored among the strings;
    applying a second voltage to a first selection line corresponding to the first string;
    applying a third voltage to a selection word line corresponding to the first memory cell among the word lines; and
    applying a fourth voltage to a first word line corresponding to a second memory cell among the word lines, the second memory cell being immediately adjacent to the first memory cell in the first string;
    wherein the first voltage is different from the fourth voltage, the fourth voltage is higher than a voltage applied to a second bit line that is adjacent to the first bit line, and the voltage applied to the second bit line is higher than the second voltage.

13. The method of claim 12, wherein the strings further include:
    a vertical channel pattern covering a side wall of the date storage pattern; and a vertical semiconductor pattern surrounded by the vertical channel pattern,
wherein the vertical semiconductor pattern includes an undoped semiconductor pattern.

14. The method of claim 12, wherein the first voltage is higher than the fourth voltage, and the fourth voltage is higher than the third voltage.

15. The method of claim 14, wherein the fourth voltage is higher than the second voltage, and the second voltage is higher than the third voltage.

16. The method of claim 12, wherein the first voltage is higher than the second voltage.

17. The method of claim 13, further comprising:
injecting and diffusing holes into the vertical channel pattern or the vertical semiconductor pattern corresponding to the first string.

18. The method of claim 12, further comprising:
applying a voltage that is lower than the first voltage to the second bit line being adjacent to the first bit line; and
applying the first voltage to a second selection line corresponding to an adjacent string being adjacent to the first string.

* * * * *